(12) United States Patent
Nozaki et al.

(10) Patent No.: US 7,662,539 B2
(45) Date of Patent: Feb. 16, 2010

(54) RESIST PATTERN THICKENING MATERIAL, PROCESS FOR FORMING RESIST PATTERN, AND PROCESS FOR MANUFACTURING SEMICONDUCTOR DEVICE

(75) Inventors: Koji Nozaki, Kawasaki (JP); Miwa Kozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/909,888

(22) Filed: Aug. 3, 2004

(65) Prior Publication Data

US 2005/0031987 A1   Feb. 10, 2005

(30) Foreign Application Priority Data

Aug. 4, 2003   (WO) .................. PCT/JP03/09867

(51) Int. Cl.
  *G03F 7/00* (2006.01)
  *G03F 7/004* (2006.01)
(52) U.S. Cl. .............. 430/273.1; 430/270.1; 430/905; 430/913; 430/330; 430/331
(58) Field of Classification Search ........... 430/270.1, 430/313
  See application file for complete search history.

(56) References Cited

U.S. PATENT DOCUMENTS

| | | | | |
|---|---|---|---|---|
| 4,735,997 A | | 4/1988 | Levin et al. | |
| 5,120,799 A | * | 6/1992 | Wade et al. | 525/353 |
| 5,162,431 A | * | 11/1992 | Potts et al. | 525/61 |
| 5,278,022 A | * | 1/1994 | Wade et al. | 430/176 |
| 5,384,229 A | * | 1/1995 | Pai et al. | 430/270.1 |
| 6,042,997 A | * | 3/2000 | Barclay et al. | 430/315 |
| 6,048,637 A | * | 4/2000 | Tsukahara et al. | 429/53 |
| 6,319,853 B1 | * | 11/2001 | Ishibashi et al. | 438/780 |
| 6,329,119 B1 | * | 12/2001 | Suetsugu et al. | 430/270.1 |
| 6,410,677 B1 | * | 6/2002 | Enoki et al. | 528/170 |
| 6,416,939 B1 | * | 7/2002 | Shimada et al. | 430/325 |
| 6,555,607 B1 | | 4/2003 | Kanda et al. | 524/366 |
| 6,579,657 B1 | * | 6/2003 | Ishibashi et al. | 430/270.1 |
| 6,593,063 B1 | | 7/2003 | Tanaka et al. | |
| 2003/0143490 A1 | | 7/2003 | Kozawa et al. | |
| 2003/0157801 A1 | * | 8/2003 | Kozawa et al. | 438/689 |
| 2004/0137378 A1 | | 7/2004 | Sugeta et al. | 430/325 |
| 2006/0183218 A1 | | 8/2006 | Takahashi et al. | 435/287 |

FOREIGN PATENT DOCUMENTS

EP   1 152 036   11/2001

(Continued)

OTHER PUBLICATIONS

English language machine translation of JP 2001-33984.*

(Continued)

*Primary Examiner*—Amanda C. Walke
(74) *Attorney, Agent, or Firm*—Kratz, Quintos & Hanson, LLP

(57) ABSTRACT

The present invention provides a resist pattern thickening material which can thicken a resist pattern and form a fine space pattern, exceeding exposure limits of exposure light used during patterning. The resist pattern thickening material contains a resin and a phase transfer catalyst. The present invention also provides a process for forming a resist pattern and a process for manufacturing a semiconductor device, wherein the resist pattern thickening material of the present invention is suitably utilized.

56 Claims, 16 Drawing Sheets

FOREIGN PATENT DOCUMENTS

| | | |
|---|---|---|
| EP | 1398671 | 3/2004 |
| EP | 1 429 185 A1 | 6/2004 |
| JP | 5-197151 | 8/1993 |
| JP | 06093019 | 4/1994 |
| JP | 09222727 | 8/1997 |
| JP | 10-73927 | 3/1998 |
| JP | 11-204399 | 7/1999 |
| JP | 2000-267268 | 9/2000 |
| JP | 2000-347414 | 12/2000 |
| JP | 2001-19860 | 1/2001 |
| JP | 2001033984 A * | 2/2001 |
| JP | 2001109165 A * | 4/2001 |
| JP | 2001-228616 | 8/2001 |
| JP | 2002-6491 | 1/2002 |
| JP | 2002-49161 | 2/2002 |
| JP | 2002107971 | 4/2002 |
| JP | 2003-84457 | 3/2003 |
| JP | 2003-131400 | 5/2003 |
| JP | 2004-53723 | 2/2004 |
| WO | WO 01/59026 | 8/2001 |
| WO | 02/10858 | 2/2002 |
| WO | WO 03/040832 A1 | 5/2003 |
| WO | WO 2005/008340 A1 | 1/2005 |

OTHER PUBLICATIONS

English language machine translation of JP 2001-109165.*
European Search Report for corresponding European Patent Application No. EP 04 01 8459 dated Apr. 5, 2005.
T. Ishibashi et al.; "Advanced Micro-Lithography Process with Chemical Shrink Technology", Jpn J. Appl. Phys., vol. 40, 2001, pp. 419-425.
M. Terai et al., "Below 70-nm Contact Hole Pattern with RELACS Process on ArF Resist", Proc. of SPIE, vol. 5039, 2003, pp. 789-797.
Taiwan Patent Office Action for corresponding Taiwanese patent application dated Aug. 22, 2006. (Citing References AA, AF and AG.).
Japanese Office Action dated Jun. 2, 2009, with English Translation.

* cited by examiner

RESIST PATTERN THICKENING MATERIAL, PROCESS FOR FORMING RESIST PATTERN, AND PROCESS FOR MANUFACTURING SEMICONDUCTOR DEVICE

CROSS-REFERENCE TO RELATED APPLICATIONS

This application is based upon and claims the benefit of priority from the prior International Patent Application No. PCT/JP03/09867, filed on Aug. 4, 2003, the entire contents of which are incorporated herein by reference.

BACKGROUND OF THE INVENTION

1. Field of the Invention

The present invention relates to a resist pattern thickening material which is applied over a resist pattern to be thickened and is capable of thickening the resist pattern to be thickened, and which can form a fine space pattern, exceeding exposure limits of light sources of existing exposure devices ("space pattern" is hereby defined as a hole, groove, recess, or any other empty space that is formed by a developed (removed) resist). The present invention also relates to a process for forming a resist pattern and a process for manufacturing a semiconductor device, all of which use the resist pattern thickening material.

2. Description of the Related Art

Semiconductor integrated circuits are becoming more highly integrated, and LSIs and VLSIs are being put into practical use. Accompanying this trend, the wiring patterns extend to regions of 0.2 µm or less, and the smallest patterns extend to regions of 0.1 µm or less. A lithographic technique is extremely important in forming fine wiring patterns. In the lithographic technique, a substrate to be processed on which a thin film is formed, is coated by a resist film, is selectively exposed, and thereafter, is developed so as to form a resist pattern. Dry etching is carried out by using the resist pattern as a mask, and thereafter, by removing the resist pattern, the desired pattern is obtained.

In forming a fine wiring pattern utilizing the lithographic technique, it is necessary to make the light source of the exposure device be a short wavelength, as well as newly developing resist materials which have high resolution and is suitable to the characteristics of the light source. However, in order to make a light source of an exposure device be a short wavelength, it is necessary to update the exposure device, which results in very high costs. Further, the development of new resist materials suitable for an exposure with light of short wavelength is not easy.

To overcome the above technical problems, there has been proposed a technique wherein a resist pattern formed of a resist material is formed and thickened by using a resist pattern thickening material capable of forming a fine space pattern. In the art, the resist pattern thickening material is sometimes referred to a resist swelling agent.

For instance, Japanese Patent Application Laid-Open (JP-A) No. 10-73927 disclose a technique which is called RELACS, and can form a fine space pattern by using KrF (krypton fluoride) excimer laser light (wavelength: 248 nm) which is deep ultraviolet light as the exposure light of a resist. In this technique, a resist pattern is formed by exposing a resist (a positive resist or a negative resist) by using a KrF (krypton fluoride) excimer laser light (wavelength: 248 nm) as the exposure light. Thereafter, by using a water-soluble resin composition, a coated film is provided so as to cover the resist pattern. The coated film and the resist pattern are made to interact at the interface thereof by using the residual acid within the material of the resist pattern, and the resist pattern is thickened. (Hereinafter, this thickening of the resist pattern will be referred to upon occasion as "swelling".) In this way, the distance between the resist patterns is shortened, and a fine space pattern is formed.

However, in the case of RELACS, the KrF resist which is used strongly absorbs ArF excimer laser light, since the KrF resist is formed of an aromatic resin composition such as a novolak resin, naphthoquinonediazide resin or the like, and an aromatic ring contained therein allows KrF excimer laser light (wavelength: 248 nm) pass through but absorbs light having a shorter wavelength than the KrF excimer laser light, i.e., ArF excimer laser light (wavelength: 193 nm). Thus, the ArF excimer laser light cannot pass through the KrF resist. There is therefore the problem that ArF excimer laser light cannot be used as the exposure light. Moreover, there is a problem in the RELACS technique that the resist swelling agent is effective for thickening (swelling) the KrF resist but not for thickening (swelling) the ArF resist.

From the standpoint of forming a fine wiring pattern, it is desirable to be able to use light of a shorter wavelength than KrF excimer laser light, e.g., ArF excimer laser light, as the light source of the exposure device. In case x-ray or electron beam having a shorter wavelength than ArF excimer laser light is used as exposure light of the resist to form the pattern, however, it results in high cost and low productivity. Thus, the utilization of ArF excimer laser light is desired.

Accordingly, the current situation is that there has not yet been developed a technique which can use ArF excimer laser light as the light source of an exposure device during patterning, which can sufficiently thicken ArF resist pattern or the like that cannot be thickened by using a resist swelling agent used in the RELACS technique, and which can easily form a fine space pattern at low cost.

An object of the present invention is to provide a resist pattern thickening material, which can utilize ArF excimer laser light as exposure light during patterning; which, when applied over a resist pattern to be thickened, can efficiently thicken the resist pattern to be thickened, e.g., in form of line-space pattern, regardless of the size of the resist pattern to be thickened; and which is suited for forming a fine space pattern, exceeding exposure limits of light sources of existing exposure devices.

Another object of the present invention is to provide a process for forming a resist pattern which, during patterning a resist pattern to be thickened, can utilize, as is, light sources (such as ArF excimer laser light and the like) of existing exposure devices; which can efficiently thicken the resist pattern to be thickened, e.g., in form of line-space pattern, regardless of the size of resist pattern to be thickened; which has excellent mass productivity; and which can finely manufacture a space pattern at low cost and high productivity, exceeding the exposure limits of such light sources, regardless of the material or the size of the resist pattern to be thickened.

Yet another object of the present invention is to provide a process for manufacturing a semiconductor device which, by using a space pattern which has been formed to be fine, can form a fine pattern on a substrate which is an oxide film, a nitride film, or the like, and which can efficiently mass produce high-performance semiconductor devices having fine wiring and the like.

SUMMARY OF THE INVENTION

The resist pattern thickening material of the present invention comprises a resin and a phase transfer catalyst. When the resist pattern thickening material is applied over a resist pattern to be thickened, among the applied resist pattern thickening material, the portions thereof in a vicinity of the interface with the resist pattern to be thickened seep into the resist pattern to be thickened and cause an interaction, i.e., mixing, with the material of the resist pattern to be thickened. At this time, because the affinity between the resist pattern thickening material and the resist pattern to be thickened is good, a surface layer (mixing layer), in which the resist pattern thickening material and the resist pattern to be thickened have mixed and become integral, is efficiently formed on the surface of the resist pattern to be thickened. As a result, the resist pattern to be thickened is efficiently thickened by the resist pattern thickening material. The resist pattern which is formed in this way (which hereinafter will be termed "thickened resist pattern" upon occasion) has been thickened by the resist pattern thickening material. Thus, the space pattern formed by the resist pattern exceeds exposure limits and has a finer structure.

Further noticeable feature of the present invention is that the resist pattern thickening material of the present invention comprises a phase transfer catalyst, thus the resist pattern is efficiently and uniformly thickened regardless of a material or size of the resist pattern. With utilization of the present invention, therefore, the thickening effect of the resist pattern is not adversely affected by a material or size of the resist pattern. The resist pattern thickening material of the present invention is suitably utilized for forming a line-space pattern on a wiring layer of LOGIC LSI wherein a various size of resist patterns are existed.

In the process for forming a resist pattern of the present invention, after a resist pattern to be thickened is formed, the resist pattern thickening material of the present invention is applied so as to cover a surface of the resist pattern to be thickened, such that a resist pattern, in which the resist pattern to be thickened has been thickened, is formed. In the process for forming a resist pattern of the present invention, when the resist pattern thickening material is applied over a formed resist pattern to be thickened, among the applied resist pattern thickening material, the portions thereof in a vicinity of the interface with the resist pattern to be thickened seep into the resist pattern to be thickened and cause an interaction (mixing) with the material of the resist pattern to be thickened. Thus, at the surface of the resist pattern to be thickened, the resist pattern thickening material and the resist pattern to be thickened become integral, and the resist pattern to be thickened is thickened to form a surface layer (mixing layer). The resist pattern which is formed in this way has been uniformly thickened by the resist pattern thickening material. Thus, the space pattern formed by the resist pattern exceeds exposure limits and has a finer structure.

Further noticeable feature of the present invention is that the resist pattern thickening material comprises a phase transfer catalyst, thus the resist pattern is efficiently and uniformly thickened regardless of a material or size of the resist pattern. With utilization of such resist pattern thickening material, therefore, the thickening effect of the resist pattern is hardly affected by the material or size of the resist pattern. The process for forming a resist pattern of the present invention is suitably applicable for a formation of a line-space pattern used in a wiring layer of LOGIC LSI wherein a various size of resist patterns are existed.

The process for manufacturing a semiconductor device of the present invention comprises: a resist pattern forming step in which, after a resist pattern to be thickened is formed on a substrate, the resist pattern thickening material of the present invention is applied so as to cover a surface of the resist pattern to be thickened, thereby thickening the resist pattern and forming a resist pattern; and a patterning step in which the substrate is subjected to an etching using the resist pattern as a mask so as to pattern the substrate.

In the process for manufacturing a semiconductor device of the present invention, after a resist pattern to be thickened is formed on a substrate, the resist pattern thickening material is applied over the resist pattern to be thickened. Then, among the applied resist pattern thickening material, the portions thereof in a vicinity of the interface with the resist pattern to be thickened seep into the resist pattern to be thickened and cause an interaction (mixing) with the material of the resist pattern to be thickened. Thus, at the surface of the resist pattern to be thickened, the resist pattern thickening material and the resist pattern to be thickened become integral to form a surface layer (mixing layer), and the resist pattern to be thickened is thickened. The resist pattern which is formed in this way has been thickened by the resist pattern thickening material. Thus, the space pattern formed by the resist pattern exceeds exposure limits and has a finer structure. Moreover, the aforementioned resist pattern thickening material comprises a phase transfer catalyst, thus the resist pattern is efficiently and uniformly thickened regardless of a material or size of the resist pattern. With utilization of such resist pattern thickening material, therefore, the thickening effect of the resist pattern is hardly affected by a material or size of the resist pattern. The process for manufacturing a semiconductor device of the present invention is able to efficiently and accurately form a line-space pattern on a wiring layer of a semiconductor device, especially LOGIC LSI, wherein a various size of resist patterns are existed.

Further, because the substrate is patterned by etching, using the resist pattern as a mask, a high-quality, high-performance semiconductor device having an extremely fine pattern is efficiently manufactured.

Figure 1:
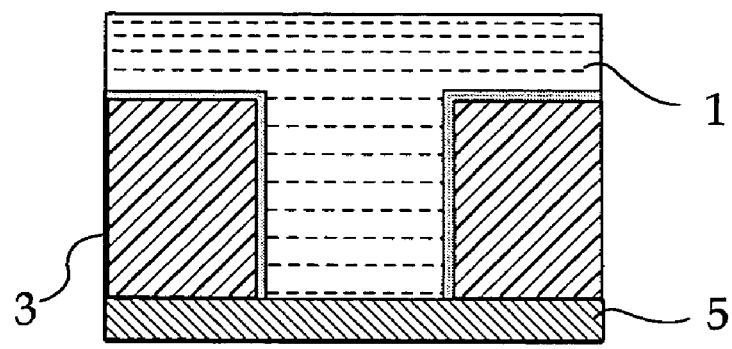
FIG. 1 is a schematic diagram for explaining one example of the mechanism of thickening a resist pattern to be thickened by using a resist pattern thickening material of the present invention, and showing the state where the resist pattern thickening material is applied over the surface of the resist pattern to be thickened.

DESCRIPTION OF THE PREFERRED EMBODIMENTS (Resist Pattern Thickening Material)

The resist pattern thickening material of the present invention comprises a resin and a phase transfer catalyst. As needed, the resist pattern thickening material may also include a crosslinking agent, a surfactant, a cyclic structure-containing compound, an organic solvent, and/or other components which are appropriately selected.

The resist pattern thickening material of the present invention is water-soluble or alkali-soluble.

The water-solubility of the resist pattern thickening material is not particularly limited and suitably adjusted according to the purpose, but it is preferable that the resist pattern thickening material dissolves 0.1 g or more in 100 g of water at a water-temperature of 25° C.

The alkali-solubility of the resist pattern thickening material is not particularly limited and suitably adjusted according to the purpose, but it is preferable that the resist pattern thickening material dissolves 0.1 g or more in 100 g of a 2.38% by mass tetramethyl ammonium hydroxide (TMAH) aqueous solution at a solution temperature of 25° C.

The resist pattern thickening material of the present invention may be an aqueous solution, a colloid liquid, an emulsion liquid or the like, but an aqueous solution is preferable.

—Resin—

The resin is not particularly limited, and can be appropriately selected in accordance with the object. However, it is preferable that the resin is water-soluble or alkali-soluble, and it is more preferable that the resin is capable of a crosslinking reaction or capable of mixing with a water-soluble crosslinking agent.

The resin preferably comprises two or more polar groups in view of exhibiting an excellent water-solubility or alkali-solubility.

The polar group is not particularly limited and can be appropriately selected in accordance with the object. Preferable examples thereof are a hydroxyl group, an amino group, a sulfonyl group, a carbonyl group, a carboxyl group, a derivative thereof, and the like. The polar group may be contained singly, or two or more may be contained in combination.

When the resin is water-soluble, the water-soluble resin preferably exhibits water solubility of 0.1 g or more in 100 g of water at a water temperature of 25° C., and more preferably exhibits water solubility of 0.3 g or more in 100 g of water at a water temperature of 25° C., and particularly preferably exhibits water solubility of 0.5 g or more in 100 g of water at a water temperature of 25° C.

Examples of the water-soluble resin include polyvinyl alcohol, polyvinyl acetal, polyvinyl acetate, polyacrylic acid, polyvinyl pyrolidone, polyethyleneimine, polyethylene oxide, styrene - maleic acid copolymer, polyvinylamine, polyallylamine, an oxazoline group-containing water-soluble resin, a water-soluble melamine resin, a water-soluble urea resin, an alkyd resin, a sulfonamide resin, and the like.

When the resin is alkali-soluble, the alkali-soluble resin preferably exhibits alkali solubility of 0.1 g or more in 100 g of a 2.38% by mass tetramethyl ammonium hydroxide (TMAH) aqueous solution at a solution temperature of 25° C., and more preferably exhibits alkali solubility of 0.3 g or more in 100 g of 2.38% by mass TMAH aqueous solution at a solution temperature of 25° C., and particularly preferably exhibits alkali solubility of 0.5 g or more in 100 g of 2.38% by mass TMAH aqueous solution at a solution temperature of 25° C.

Examples of the alkali-soluble resin are a novolak resin, a vinylphenol resin, polyacrylic acid, polymethacrylic acid, poly p-hydroxyphenylacrylate, poly p-hydroxyphenylmethacrylate, a copolymer thereof, and the like.

A resin may be used singly, or two or more thereof may be used in combination. Among these, polyvinyl alcohol, polyvinyl acetal, polyvinyl acetate or the like is preferably. It is more preferably that the resin contains polyvinyl acetal at 5% by mass to 40% by mass.

In the present invention, the resin may be a resin having a cyclic structure at least at a portion thereof.

In such case, the cyclic structure is not particularly limited, and can be appropriately selected in accordance with the object. A resin having a cyclic structure in at lest a portion thereof may be used singly, or two or more may be used in combination.

The resin having a cyclic structure at a portion thereof is not particularly limited and can be appropriately selected in accordance with the object. However, those that can generate a crosslinking reaction are preferable. Suitable examples thereof include polyvinyl aryl acetal resins, polyvinyl aryl ether resins, polyvinyl aryl ester resins, and derivatives thereof. It is preferable to use at least one type selected therefrom. From the standpoint of exhibiting water solubility or alkali solubility to an appropriate degree, such a resin that contains an acetyl group is more preferable. These may be used singly, or in combination of two or more.

The polyvinyl aryl acetal resins are not particularly limited and may be appropriately selected in accordance with the object. Examples thereof include β-resorcinol acetal and the like.

The polyvinyl aryl ether resins are not particularly limited and may be appropriately selected in accordance with the object. Examples thereof include 4-hydroxybenzyl ether and the like.

The polyvinyl aryl ester resins are not particularly limited and may be appropriately selected in accordance with the object. Examples thereof include benzoate and the like.

The method of producing the polyvinyl aryl acetal resins is not particularly limited and may be appropriately selected in accordance with the object. A suitable example thereof is a known method of producing using a polyvinyl acetal reaction, or the like. Such a producing method is a method in which, for example, polyvinyl alcohol, and aldehyde in an amount needed stoichiometrically for the polyvinyl alcohol are made to undergo an acetalizing reaction in the presence of an acid catalyst. Specifically, suitable examples are the methods disclosed in U.S. Pat. Nos. 5,169,897 and 5,262,270, Japanese Patent Application Laid-Open (JP-A) No. 5-78414, and the like.

The method of producing the polyvinyl aryl ether resins is not particularly limited and may be appropriately selected in accordance with the object. Examples thereof are a copolymerization reaction of a corresponding vinyl aryl ether monomer and vinyl acetate; an etherizing reaction of polyvinyl alcohol and an aromatic compound having a halogenated alkyl group in the presence of a basic catalyst (the ether synthesizing reaction by Williamson); and the like. Specifically, suitable examples are the methods disclosed in JP-A Nos. 2001-40086, 2001-181383, 6-116194, and the like.

The method of producing the polyvinyl aryl ester resins is not particularly limited and may be appropriately selected in accordance with the object. Examples thereof are a copolymerization reaction of a corresponding vinyl aryl ester monomer and vinyl acetate; an esterizing reaction of polyvinyl alcohol and an aromatic carboxylic acid halide compound in the presence of a basic catalyst; and the like.

The cyclic structure in the resin having a cyclic structure at a portion thereof, is not particularly limited and may be appropriately selected in accordance with the object. Suitable examples are monocyclic structure (e.g., benzene), polycyclic structure (e.g., bisphenol), condensed ring (e.g., naphthalene), and more specifically, an aromatic structure (i.e., a residue of an aromatic compound), an alicyclic structure (i.e., a residue of an alicyclic compound), and a heterocyclic structure (i.e., a residue of a heterocyclic compound) and the like. In the resin having a cyclic structure at a portion thereof, a cyclic structure may be used singly or two or more thereof may be used in combination.

Examples of the aromatic compound are a polyhydroxy phenol compound, a polyphenol compound, an aromatic carboxylic acid compound, a naphthalene polyhydroxy compound, a benzophenone compound, a flavonoid compound, a porphin, a water-soluble phenoxy resin, an aromatic-containing water-soluble dye, a derivative thereof, a glycoside thereof, and the like. The aromatic compound may be used singly, or two or more may be used in combination.

Examples of the polyhydroxy phenol compound are resorcinol, resorcin[4]arene, pyrogallol, gallic acid, a derivative and a glycoside thereof, and the like.

Examples of the polyphenol compound and a derivative thereof include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, a derivative and a glycoside thereof, and the like.

Examples of the aromatic carboxylic acid compound and a derivative thereof include salicylic acid, phthalic acid, dihydroxy benzoic acid, tannin, a derivative and a glycoside thereof, and the like.

Examples of the naphthalene polyhydroxy compound and a derivative thereof include naphthalene diol, naphthalene triol, a derivative and a glycoside thereof, and the like.

Examples of the benzophenone compound and a derivative thereof include alizarin yellow A, a derivative and a glycoside thereof, and the like.

Examples of the flavonoid compound and a derivative thereof include flavone, isoflavone, flavanol, flavonone, flavonol, flavan-3-ol, aurone, chalcone, dihydrochalcone, quercetin, a derivative and a glycoside thereof, and the like.

Examples of the alicyclic compound are a polycycloalkane, a cycloalkane, fused rings, a derivative and a glycoside thereof, and the like. The alicyclic compound may be used singly, or two or more may be used in combination.

Examples of the polycycloalkane are norbornane, adamantane, norpinane, sterane, and the like.

Examples of the cycloalkane are cyclopentane, cyclohexane, and the like.

Examples of the fused rings are steroids and the like.

Suitable examples of the heterocyclic compound include a nitrogen-containing cyclic compound such as pyrrolidine, pyridine, imidazole, oxazole, morpholine, pyrrolidone, and the like; and an oxygen-containing cyclic compound such as furan, pyran, saccharides such as pentose and hexose, and the like.

Among the resins having a cyclic structure at least at a portion thereof, those having at least one functional group selected from a hydroxyl group, a cyan group, an alkoxyl group, a carboxyl group, an amino group, an amid group, an alkoxycarbonyl group, a hydroxyalkyl group, a sulfonyl group, an anhydride group, a lacton group, a cyanate group, an isocyanate group, a ketone group, a derivate thereof and a glycoside thereof, are preferable from a standpoint of exhibiting appropriate water-solubility. More preferable are those having at least one functional group selected from a hydroxyl group, an amino group, a sulfonyl group, a carboxyl group, and a derivative thereof.

When the resin has a cyclic structure in at least a portion thereof, the molar content of the cyclic structure is not particularly limited and can be appropriately selected in accordance with the object. However, when high etching resistance is needed, a molar content of 5 mol % or more is preferable, and 10 mol % or more is more preferable.

Note that the molar content can be measured by using, for example, NMR or the like.

The content of the resin including the resin having a cyclic structure at least at a portion thereof in the resist pattern thickening material differs in accordance with the amount of the surfactant which will be described hereinafter and the like, and cannot be stipulated unconditionally, and can be appropriately selected in accordance with the object.

—Phase Transfer Catalyst—

The phase transfer catalyst is not particularly limited and may be appropriately selected in accordance with an object. Examples are organic compounds.

When the resist pattern thickening material comprises the phase transfer catalyst, it is advantageous that the resist pattern to be thickened is efficiently and uniformly thickened regardless of a material thereof and the thickening effect shows less dependency to a material of the resist pattern to be thickened. In addition, this function of the phase transfer catalyst is not adversely affected by an acid generator which may be contained in the resist pattern to be thickened.

The phase transfer catalyst is preferably water-soluble, and exhibits a water-solubility of 0.1 g in 100 g of water at a water-temperature of 25° C.

Examples of the phase transfer catalyst are crown ethers, azacrown ethers, omuni salts, and the like.

The phase transfer catalyst may be used singly or two or more thereof may be used in combination. Among these, the onium salt is preferably from the standpoint of solubility to water.

Examples of the crown ether and azacrown ether are 18-crown-6, 15-crown-5, 1-aza-18-crown-6, 13-diaza-18-crown-6, 1,4,7-triazacyclononane, and the like.

The onium salt is not particularly limited and may be appropriately selected in accordance with an object, but suitably examples thereof are a quaternary ammonium salt, a pyridinium salt, a thiazolium salt, a phosphonium salt, piperazinium salt, an ephedrinium salt, a quininium salt, and a cinchoninium salt, and the like.

Examples of the quaternary ammonium salt are those used as a organic synthesis reagent, namely, tetrabutylammonium hydrogensulfate, tetramethylammonium acetate, tetramethylammonium chloride, and the like.

Examples of the pyridinium salt are hexadecylpyridinium bromide, and the like.

Examples of the thiazolium salt are 3-benxyl-5-(2-hydroxyethyl)-4-methylthiazolium chloride, and the like.

Examples of the phosphonium salt are tetrabutylphosphonium chloride, and the like.

Examples of the piperazinium salt are 1,1-dimethyl-4-phenylpiperazinium iodide, and the like.

Examples of the ephdrinium salt are ((−)-N,N-dimethylephedrinium bromide), and the like.

Examples of the quininium salt are N-benzylquininium chloride, and the like.

Examples of the cinchoninium salt are N-benxylcinchoninium chloride, and the like.

The content of the phase transfer catalyst is not particularly limited to a certain range, but can be appropriately adjusted with accordance with a type and amount of the resin for use. Suitable content thereof is, for example, 10,000 ppm or less, preferably 10 ppm to 10,000 ppm, more preferably 10 ppm to 5,000 ppm, and further preferably 10 ppm to 3,000 ppm.

When the content of the phase transfer catalyst is 10,000 ppm or less, the resist pattern to be thickened, e.g., line-space pattern, is efficiently thickened regardless of a size of the resist pattern thickened.

The aforementioned content of the phase transfer catalyst in the resist pattern thickening material can be determined by liquid chromatography.

—Crosslinking Agent—

The crosslinking agent is not particularly limited and appropriately selected in accordance with an object, provided that it is water-soluble and form a crosslink by heat or an acid. Suitable examples thereof are amino crosslinking agents and the like.

Examples of the amino crosslinking agents are melamine derivatives, urea derivatives, uril derivatives, and the like, and these may be used singly or in combination of two or more.

Examples of the urea derivatives are urea, alkoxymethylene urea, N-alkoxymethylene urea, ethylene urea, ethylene urea carbonate, a derivative thereof, and the like.

Examples of the melamine derivatives are alkoxymethyl melamine, a derivative thereof, and the like.

Examples of the uril derivatives are benzoguanamine, glycol uril, a derivative thereof, and the like.

The content of the crosslinking agent in the resist pattern thickening material is not particularly limited to a certain range, but appropriately adjusted in accordance with a type or content of the resin and phase transfer catalyst.

—Surfactant—

The surfactant is not particularly limited and can be appropriately selected in accordance with the object. Examples include a non-ionic surfactant, a cationic surfactant, an anionic surfactant, an amphoteric surfactant, and the like. The surfactant may be used singly, or two or more may be used in combination. Among these, those not containing a metal ion such as sodium ion, potassium ion, and the like are preferably, and a non-ionic surfactant is more preferable.

In the resist pattern thickening material of the present invention, the surfactant functions as a reaction assistant for a thickening reaction of the resist pattern to be thickened, thus the resist pattern to be thickened can be efficiently thickened.

Suitable examples of a non-ionic surfactant include a surfactant selected from among an alkoxylate surfactant, a fatty acid ester surfactant, an amide surfactant, an alcohol surfactant, and an ethylene diamine surfactant. Specific examples thereof include a polyoxyethylene-polyoxypropylene condensation product compound, a polyoxyalkylene alkylether compound, a polyoxyethylene alkylether compound, a polyoxyethylene derivative compound, a sorbitan fatty acid ester compound, a glycerin fatty acid ester compound, a primary alcohol ethoxylate compound, a phenol ethoxylate compound, and a nonylphenol ethoxylate surfactant, an octylphenol ethoxylate surfactant, a lauryl alcohol ethoxylate surfactant, a oleyl alcohol ethoxylate surfactant, a fatty acid ester surfactant, an amide surfactant, a natural alcohol surfactant, an ethylene diamine surfactant, and a secondary alcohol ethoxylate surfactant, and the like.

The cationic surfactant is not particularly limited and can be appropriately selected in accordance with the object. Examples include an alkyl cationic surfactant, an amide quaternary cationic surfactant, an ester quaternary cationic surfactant, and the like.

The amphoteric surfactant is not particularly limited and can be appropriately selected in accordance with the object. Examples include an amine oxide surfactant, a betaine surfactant, and the like.

The content of the surfactant in the resist pattern thickening material differs in accordance with the type, the content, and the like of the resin and the like, and cannot be stipulated unconditionally, and can be appropriately selected in accordance with the object. Suitable range of the content of the surfactant is, for example, 0.01% by mass to 5% by mass, and preferably 0.05% by mass to 0.5% by mass.

—Cyclic Structure-Containing Compound—

The cyclic structure-containing compound is not particularly limited provided that it contains a cyclic structure therein, and can be appropriately selected in accordance with the object. Suitably examples thereof are an aromatic compound, an alicyclic compound and a heterocyclic compound, which may be contained singly or in combination of two or more.

The cyclic structure-containing compound is preferably a compound exhibiting water solubility of 0.1 g or more, and more preferably exhibiting water solubility of 0.3 g or more, and particularly preferably exhibiting water solubility of 0.5 g or more, in 100 g of water at a water-temperature of 25° C.

In the resist pattern thickening material of the present invention, the cyclic structure-containing compound contributes in markedly improving an etching resistance of the obtained resist pattern due to a cyclic structure contained therein.

Examples of the aromatic compound are polyphenol compounds, aromatic carboxylic acid compounds, naphthalene polyhydroxyl compounds, benzophenone compounds, flavonoid compounds, porphin, water-soluble phenoxy resins, aromatic-containing water-soluble dyes, derivatives thereof, glycosides thereof, and the like. These may be used singly, or in combination of two or more.

Examples of the polyphenol compounds and derivatives thereof include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, resorcinol, resorcinol [4] arene, pyrogallol, gallic acid, derivatives and glycosides thereof, and the like.

Examples of the aromatic carboxylic acid compounds and derivatives thereof include salicylic acid, phthalic acid, dihydroxy benzoic acid, tannin, derivatives and glycosides thereof, and the like.

Examples of the benzophenone compounds and derivatives thereof include alizarin yellow A, derivatives and glycosides thereof, and the like.

Examples of the flavonoid compounds and derivatives thereof include flavone, isoflavone, flavanol, flavonone, flavonol, flavan-3-ol, aurone, chalcone, dihydrochalcone, quercetin, derivatives and glycosides thereof, and the like.

The aromatic compound can be used singly or in combination of two or more. Among the aforementioned aromatic compound, catechin, resorcinol, and the like are preferably.

Suitable examples of the alicyclic compound are a polycycloalkane, a cycloalkane, fused rings, a derivative and a glycoside thereof, and the like. The alicyclic compound may be used singly, or in combination of two or more.

Examples of the polycycloalkane are norbornane, adamantane, norpinane, sterane, and the like.

Examples of the cycloalkane are cyclopentane, cyclohexane, and the like.

Examples of the fused rings are steroids and the like.

Suitable examples of the heterocyclic compound include a nitrogen-containing cyclic compound such as pyrrolidine, pyridine, imidazole, oxazole, morpholine, pyrrolidone, and the like; and an oxygen-containing cyclic compound such as furan, pyran, saccharides such as pentose and hexose, and the like.

Among the aforementioned cyclic structure-containing compounds, from the standpoint of excellent water solubility, those having two or more polar groups are preferable, those having three or more polar groups are more preferable, and those having four or more polar groups are particularly preferable.

The polar groups are not particularly limited, and may be appropriately selected in accordance with the object. Examples thereof include a hydroxyl group, a carboxyl group, a carbonyl group, a sulfonyl group, and the like.

The content of the cyclic structure-containing compound in the resist pattern thickening material can be appropriately determined in accordance with the type, the content, and the like of the resin, the crosslinking agent, the nitrogen-containing compound, and the like.

—Organic Solvent—

The resist pattern thickening material may contain organic solvents to improve the solubility of the resin, the surfactant, and the like in the resist pattern thickening material, to improve an anti-forming property or coating property thereof, and to inhibit a growth of microorganism.

The organic solvent is not particularly limited, and can be appropriately selected in accordance with the object. Examples include alcohols, straight chain esters, cyclic esters, ketones, straight chain ethers, cyclic ethers, and the like.

Examples of the alcohol are methanol, ethanol, propyl alcohol, isopropyl alcohol (IPA), butyl alcohol, and the like.

Examples of the straight-chain ester are ethyl lactate, propylene glycol methyl ether acetate (PGMEA), and the like.

Examples of the cyclic ester are lactones such as γ-butyrolactone, and the like.

Examples of the ketone are acetone, cyclohexanone, heptanone, and the like.

Examples of the straight-chain ether are ethylene glycol dimethylether, and the like.

Examples of the cyclic ether are tetrahydrofuran, dioxane, and the like.

The organic solvent may be used singly, or two or more may be used in combination. Thereamong, an organic solvent having sufficient solubility to water whish is used as a solvent of the resist pattern thickening material is preferable, an organic solvent having a boiling point of around 80° C. to about 200° C. is more preferable from the standpoint of accurate and fine patterning, isopropyl alcohol is particularly preferably from the standpoint of an improvement in the anti-forming and coating properties of the resist pattern thickening material, an inhibition of the growth of microorganism, and an improvement in a solubility of the components.

The content of the organic solvent in the resist pattern thickening material can be appropriately determined in accordance with the type, the content, and the like of the resin, the surfactant, and the like. The content of the organic solvent is preferably 0.01% by mass to 10% by mass, and more preferably 0.1% by mass to 5% by mass.

—Other Components—

The other components are not particularly limited provided that they do not adversely affect the effects of the present invention, and can be appropriately selected in accordance with the object. Examples are various types of known additives such as crosslinking agents, thermal acid generating agents, quenchers such as amine type, amide type, ammonium chloride type quenchers, and the like.

The content of the other components in the resist pattern thickening material can be appropriately determined in accordance with the type, the content and the like of the resin, the surfactant, and the like.

—Use and the Like—

The resist pattern thickening material of the present invention can, as a use thereof, coat the resist pattern to be thickened.

At the time of coating, the surfactant may be applied before and separately from coating of the resist pattern thickening material, without being contained in the resist pattern thickening material.

When the resist pattern thickening material is applied over the resist pattern to be thickened, the resist pattern to be thickened thickens, and a resist pattern is formed.

Since the resist pattern thickening material comprises a phase transfer catalyst, the resist pattern thickening material is able to uniformly and efficiently thicken the resist pattern to be thickened without being affected by storage conditions of the resist pattern thickening material, thereby obtaining a thickened resist pattern without being affected by a material of the resist pattern to be thickened.

The diameter or width (the dimension of the opening) of the space patterns formed in this way is smaller than those of the former space patterns. The exposure limit of the light source of the exposure device used at the time of patterning the resist pattern to be thickened is exceeded, such that an even finer space pattern is formed. For example, in a case in which ArF excimer laser light is used at the time of patterning the resist pattern to be thickened, when a resist pattern is formed by thickening the obtained resist pattern to be thickened by using the resist pattern thickening material of the present invention, the formed space pattern is a fine pattern which is comparable to that patterned by an electron beam.

Note that, at this time, the amount of thickening of the resist pattern to be thickened can be controlled to a desired degree by appropriately adjusting the viscosity of the resist pattern thickening material, the coating thickness of the resist pattern thickening material, the baking temperature, the baking time, and the like.

—Material of Resist Pattern to be Thickened—

The material of the resist pattern to be thickened (the resist pattern on which the resist pattern thickening material of the present invention is applied) is not particularly limited, and can be appropriately selected from among known resist materials in accordance with the object. The material of the resist pattern to be thickened may be either of a negative type or a positive type. Suitable examples include g-line resists, i-line resists, KrF resists, ArF resists, $F_2$ resists, electron beam resists, and the like, which can be patterned by g-line, i-line, KrF excimer laser light, ArF excimer laser light, $F_2$ excimer laser light, electron beams, and the like, respectively. These resists may be chemically amplified types, or non-chemically amplified types. Among these, a KrF resist, an ArF resist, a resist containing an acrylic resin and the like are preferable, and at least one of an ArF resist and a resist containing an acrylic resin is more preferable.

Specific examples of the material of the resist to be thickened are novolak resists, polyhydroxystyrene (PHS) resists, acrylic resists, cycloolefin—maleic acid anhydride (COMA) resists, cycloolefin resists, hybrid (alicyclic acryl—COMA copolymer) resists, and the like. These materials may be fluorine-modified or the like.

The process for forming the resist pattern to be thickened, and the size, the thickness and the like of the resist pattern to be thickened are not particularly limited, and can be appropriately selected in accordance with the object. In particular, the thickness can be appropriately determined by the substrate which is the object of working, the etching conditions, and the like. However, the thickness is generally about 0.2 μm to 200 μm.

The thickening of the resist pattern to be thickened by using the resist pattern thickening material of the present invention will be described hereinafter with reference to the drawings.

Figure 2:
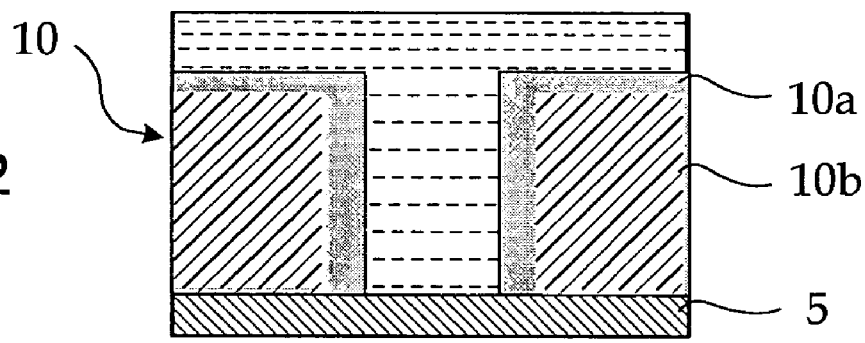
FIG. 2 is a schematic diagram for explaining one example of the mechanism of thickening a resist pattern to be thickened by using a resist pattern thickening material of the present invention, and showing the state where the resist pattern thickening material seeps into the surface of the resist pattern to be thickened.

As shown in FIG. 1, after a resist pattern to be thickened 3 has been formed on a substrate (base) 5, a resist pattern thickening material 1 is applied over the surface of the resist pattern to be thickened 3. Prebaking (heating and drying) is carried out, such that a coated film is formed. Then, as shown in FIG. 2, mixing (impregnation) of the resist pattern thickening material 1 into the resist pattern to be thickened 3 occurs at the interface between the resist pattern to be thickened 3 and the resist pattern thickening material 1. A surface layer (mixing layer) 10a is formed by the aforementioned mixing (impregnation) at the interface of an inner layer resist pattern 10b (the resist pattern to be thickened 3) and the resist pattern thickening material 1. At this time, the resist pattern thickening material comprises the aforementioned phase transfer catalyst, the inner layer resist pattern 10b (the resist pattern to be thickened 3) is efficiently and uniformly thickened without being affected by the size of the inner layer resist pattern 10b (the resist pattern to be thickened 3).

Figure 3:
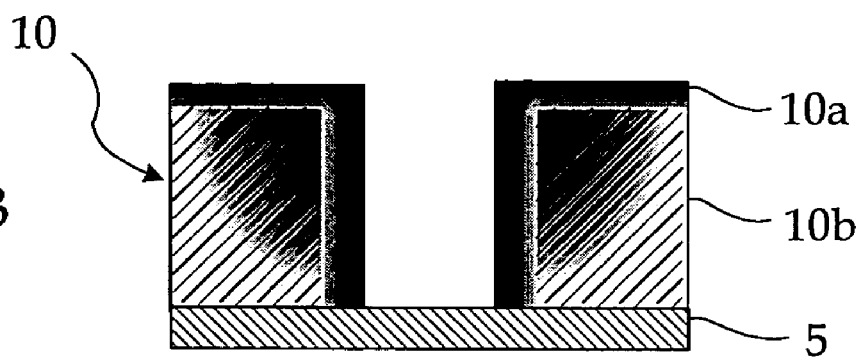
FIG. 3 is a schematic diagram for explaining one example of the mechanism of thickening a resist pattern to be thickened by using a resist pattern thickening material of the present invention, and showing the state where the resist pattern to be thickened is thickened by the resist pattern thickening material, thereby forming a resist pattern.

Thereafter, as shown in FIG. 3, by carrying out developing processing, the portions, among the applied resist pattern thickening material 1, which have not mixed with the resist pattern to be thickened 3 are dissolved and removed, and a resist pattern 10 is formed (developed).

The developing processing may be performed in water or an alkali developer.

The resist pattern 10 has, on the surface of the resist pattern 10b (the resist pattern to be thickened 3), the surface layer 10a which has been formed by the resist pattern thickening material 1 by mixing. The resist pattern 10 is thicker than the resist pattern to be thickened 3 by an amount corresponding to the thickness of the surface layer 10a. Thus, the width of the space pattern formed by the resist pattern 10 is smaller than that of the former space patterns. Thus, the exposure limit of the light source of an exposure device at the time when the resist pattern to be thickened 3 is formed is exceeded, such that the space pattern can be formed to be fine. The space pattern formed by the resist pattern 10 is finer than the former space patterns.

The surface layer 10a of the resist pattern 10 is formed by the resist pattern thickening material 1. In a case in which the resist pattern thickening material 1 contains the aforementioned cyclic structure, even if the resist pattern to be thickened 3 (the resist pattern 10b) is a material which has poor etching resistance, the obtained resist pattern 10 has, on the surface thereof, the surface layer 10a containing the cyclic structure. Therefore, the etching resistance is markedly improved.

The resist pattern thickening material of the present invention can suitably be used in thickening a resist pattern to be thickened, and making a space pattern fine, exceeding exposure limits. The resist pattern thickening material of the present invention is particularly suitably used in the process for manufacturing a semiconductor device of the present invention.

When the resist pattern thickening material of the present invention contains the cyclic structure, the resist pattern thickening material can suitably be used in covering and thickening a pattern which is exposed to plasma or the like and which is formed of resin or the like whose surface etching resistance must be improved, and can more suitably be used in cases where the cyclic structure cannot be contained in the material of the pattern.

(Process for Forming Resist Pattern)

In the process for forming a resist pattern of the present invention, after a resist pattern to be thickened is formed, the resist pattern thickening material of the present invention is applied so as to cover the surface of the resist pattern to be thickened, and a resist pattern, in which the resist pattern to be thickened has been thickened, is formed.

Suitable examples of materials of the resist pattern to be thickened are the materials listed above in the discussion of the resist pattern thickening material of the present invention.

The resist pattern to be thickened can be formed in accordance with known methods.

The resist pattern to be thickened can be formed on a substrate (a base). The substrate (base) is not particularly limited, and can be appropriately selected in accordance with the object. However, when the resist pattern to be thickened is formed into a semiconductor device, the substrate (base) is usually a substrate such as a silicon wafer, or any of various types of oxide films, or the like.

The method of applying the resist pattern thickening material is not particularly limited, and can be appropriately selected from among known coating methods in accordance with the object. Suitable examples are a spin coating method and the like. In the case in which a spin coating method is used, the conditions are as follows for example: the rotational speed is about 100 rpm to 10,000 rpm, and is preferably 800 rpm to 5,000 rpm, and the time is about one second to 10 minutes, and 1 second to 90 seconds is preferable.

The coated thickness at the time of coating is usually about 10 nm (100 Å) to 1,000 nm (10,000 Å), and about 100 nm (1,000 Å) to 500 nm (5,000 Å) is preferable.

Note that, at the time of coating, the surfactant may be coated before and separately from coating of the resist pattern thickening material, without being contained in the resist pattern thickening material.

Carrying out prebaking (heating and drying) of the applied resist pattern thickening material during applying or after applying is preferable from the standpoint that the resist pattern thickening material can be efficiently mixed (impregnated) into the resist pattern to be thickened at the interface between the resist pattern to be thickened and the resist pattern thickening material.

The conditions, the method and the like of the prebaking (heating and drying) are not particularly limited and can be appropriately selected in accordance with the object, provided that they do not cause softening of the resist pattern to be thickened. For example, the temperature is about 40° C. to 120° C., and 70° C. to 100° C. is preferable, and the time is about 10 seconds to 5 minutes, and 40 seconds to 100 seconds is preferable.

Carrying out baking of the applied resist pattern thickening material after the prebaking (heating and drying) is preferable from the standpoint that the mixing at the interface of the resist pattern to be thickened and the resist pattern thickening material can be made to proceed efficiently.

The conditions, the method and the like of the baking are not particularly limited and can be appropriately selected in accordance with the object. However, usually, a higher temperature than that at the prebaking (heating and drying) is used. The conditions of the baking are, for example, the temperature is about 70° C. to 150° C., and 90° C. to 130° C. is preferable, and the time is about 10 seconds to 5 minutes, and 40 seconds to 100 seconds is preferable.

Carrying out developing processing of the applied resist pattern thickening material after the baking is preferable. In this case, carrying out developing processing is preferable in that, among the applied resist pattern thickening material, the portions thereof which have not mixed with the resist pattern to be thickened are dissolved and removed, and the resist pattern can be developed (obtained).

The same comments as those above regarding developing processing are applicable here as well.

The process for forming the resist pattern of the present invention will be described hereinafter with reference to the drawings.

Figure 4:
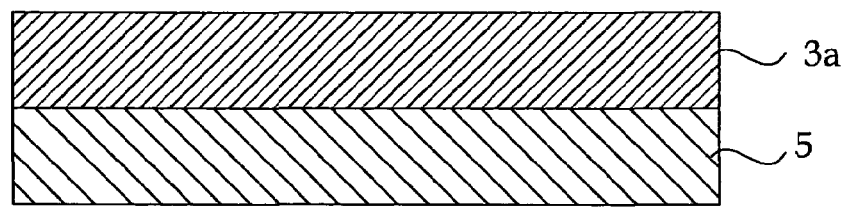
FIG. 4 is a schematic diagram for explaining an example of a process for forming a resist pattern of the present invention, and showing the state where a resist layer is formed.
Figure 5:
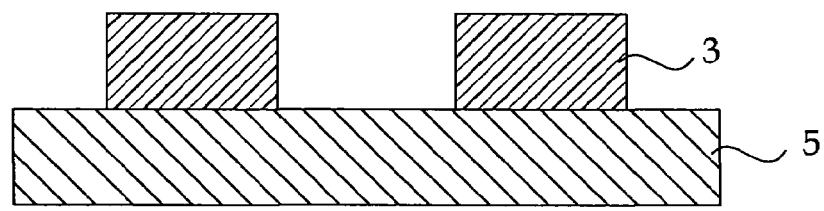
FIG. 5 is a schematic diagram for explaining an example of a process for forming a resist pattern of the present invention, and showing the state where the resist layer is subjected to a patterning, thereby forming a resist pattern to be thickened.
Figure 6:
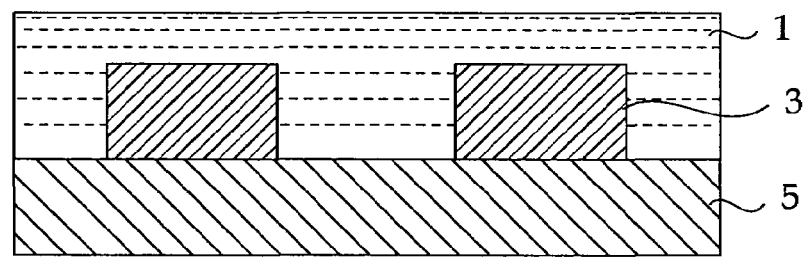
FIG. 6 is a schematic diagram for explaining an example of a process for forming a resist pattern of the present invention, and showing the state where the resist pattern thickening material is applied over the surface of the resist pattern to be thickened.
Figure 7:
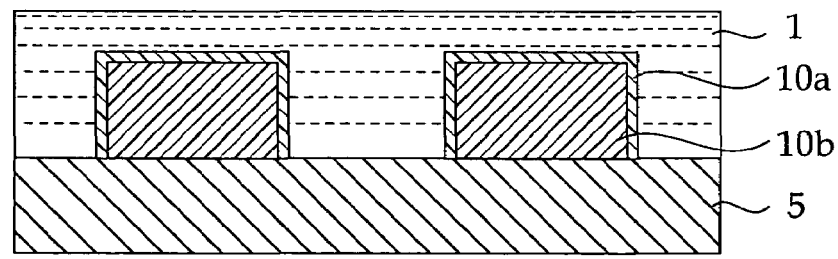
FIG. 7 is a schematic diagram for explaining an example of a process for forming a resist pattern of the present invention, and showing the state where a mixing is occurred at the vicinity of the surface of the resist pattern to be thickened and the resist pattern thickening material seeps into the resist pattern to be thickened.
Figure 8:
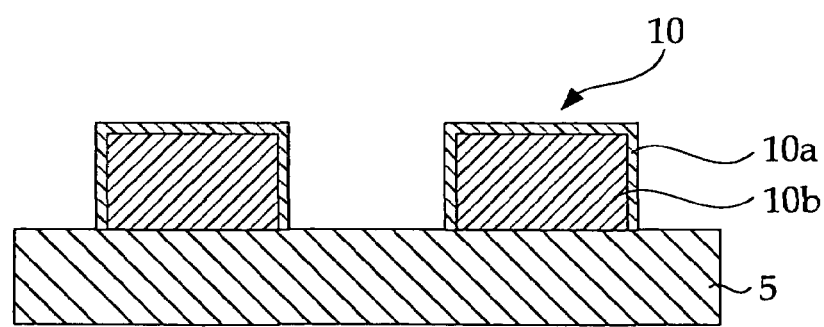
FIG. 8 is a schematic diagram for explaining an example of a process for forming a resist pattern of the present invention, and showing the state where the resist pattern thickening material is developed.

As shown in FIG. 4, a resist material 3a is coated on the substrate (base) 5. Then, as shown in FIG. 5, the resist material 3a is patterned such that the resist pattern to be thickened 3 is formed. Thereafter, as shown in FIG. 6, the resist pattern thickening material 1 is applied over the surface of the resist pattern to be thickened 3, and prebaking (heating and drying) is carried out such that a coated film is formed. Then, mixing (impregnation) of the resist pattern thickening material 1 into the resist pattern to be thickened 3 takes place at the interface of the resist pattern to be thickened 3 and the resist pattern thickening material 1. As shown in FIG. 7, a mixed (impregnated) layer is formed at the interface between the resist pattern to be thickened 3 and the resist pattern thickening material 1. Thereafter, as shown in FIG. 8, by carrying out developing processing, among the applied resist pattern thickening material 1, the portions thereof which have not mixed with the resist pattern to be thickened 3 are dissolved and removed, such that the resist pattern 10 having the surface layer 10a on the resist pattern 10b (the resist pattern to be thickened 3) is formed (developed).

The developing processing may be performed in water or an alkali aqueous solution. However, water developing is preferable from the standpoint that the developing processing can be carried out efficiently at a low cost.

The resist pattern 10 has, on the surface of the resist pattern 10b (the resist pattern to be thickened 3), the surface layer 10a which has been formed by the resist pattern thickening material 1 mixing. The resist pattern 10b (the resist pattern to be thickened 3) is uniformly thickened to form the resist pattern 10 without being adversely affected by the type of the material, the size and the like of the resist pattern 10b, since the resist pattern thickening material 1 comprises the aforementioned phase transfer catalyst. The resist pattern 10 is thicker than the resist pattern to be thickened 3 (the resist pattern 10b) by an amount corresponding to the thickness of the surface layer 10a. Thus, the width of the space pattern formed by the resist pattern 10 is smaller than that of a space pattern formed by the resist pattern to be thickened 3 (the resist pattern 10b), and the space pattern formed by the resist pattern 10 is fine.

The surface layer 10a of the resist pattern 10 is formed by the resist pattern thickening material 1. In a case in which the resist pattern thickening material 1 contains a resin having a cyclic structure in a portion thereof, thereby containing the cyclic structure in the resist pattern thickening material 1, the etching resistance is markedly improved. In this case, even if the resist pattern to be thickened 3 (the inner layer resist pattern 10b) is a material which has poor etching resistance, the resist pattern 10, which has on the surface thereof the surface layer 10a having excellent etching resistance, can be formed.

The (thickened) resist pattern which is formed by the process for forming a resist pattern of the present invention has, on the surface of the resist pattern to be thickened, the surface layer which is formed by the resist pattern thickening material of the present invention mixing. When the resist pattern thickening material contains the cyclic structure, e.g., containing a resin having a cyclic structure at least in a portion thereof, even if the resist pattern to be thickened is a material having poor etching resistance, the (thickened) resist pattern, which has the surface layer (mixing layer) having excellent etching resistance on the surface of the resist pattern to be thickened, can efficiently be fabricated. Further, the resist pattern which is fabricated by the process for forming a resist pattern of the present invention is thicker than the resist pattern to be thickened by an amount corresponding to the thickness of the surface layer (mixing layer). Therefore, the width of the space pattern formed by the fabricated, resist pattern 10 is smaller than that of a space pattern formed by the resist pattern to be thickened. Therefore, by using the process for forming a resist pattern of the present invention, a fine space pattern can be formed efficiently.

The resist pattern formed by the resist pattern thickening material of the present invention has, on the resist pattern to be thickened, the surface layer which is formed by the resist pattern thickening material of the present invention.

The resist pattern preferably has excellent etching resistance. It is preferable that the etching rate (nm/min) of the resist pattern is equivalent to or greater than that of the resist pattern to be thickened. Specifically, when measurement is carried out under the same conditions, the ratio (resist pattern to be thickened/surface layer (mixing layer)) of the etching rate (nm/min) of the surface layer (mixing layer) to the etching rate (nm/min) of the resist pattern to be thickened is preferably 1.1 or more, and is more preferably 1.2 or more, and is particularly preferably 1.3 or more.

The etching rate (nm/min) can be measured by, for example, carrying out etching processing for a predetermined time by using a known etching device, measuring the amount of film reduction of the sample, and calculating the amount of film reduction per unit time.

The surface layer (mixing layer) can suitably be formed by using the resist pattern thickening material of the present invention. From the standpoint of improving the etching resistance, the surface layer (mixing layer) preferably contains the cyclic structure, e.g., a resin having a cyclic structure at least on a portion thereof.

Whether or nor the surface layer contain the cyclic structure, can be confirmed by, for example, analyzing the IR absorption spectrum of the surface layer.

The resist pattern fabricated by the process for forming a resist pattern of the present invention can suitably be used in, for example, the fabricating of functional parts such as mask patterns, reticle patterns, recording heads, LCDs (liquid crystal displays), PDPs (plasma display panels), SAW filters (surface acoustic wave filters), and the like; optical parts used in connecting optical wiring; fine parts such as microactuators and the like; semiconductor devices; and the like. The resist pattern can suitably be used in the process for manufacturing a semiconductor device of the present invention which will be described hereinafter.

(Process for Manufacturing Semiconductor Device)

The process for manufacturing a semiconductor device of the present invention has a resist pattern forming step, and a patterning step. The process may include other steps which are appropriately selected as needed.

The resist pattern forming step is a step of, after forming a resist pattern to be thickened on a substrate, coating the resist pattern thickening material of the present invention so as to cover the surface of the resist pattern to be thickened, thereby thickening the resist pattern to be thickened and forming a resist pattern. Details of the resist pattern forming step are the same as those of the process for forming a resist pattern of the present invention.

The substrate is not particularly limited, and can be appropriately selected in accordance with the object. Examples of the substrate are surface layers of various members in semiconductor devices. Suitable examples are substrates such as silicon wafers, surface layers thereof, various types of oxide films, and the like. The resist pattern to be thickened is as described above. The method of coating is as described above. Further, after the coating, it is preferable to carry out the above-described prebaking, baking, and the like.

The patterning step is a step of patterning the substrate by carrying out etching by using (as a mask pattern or the like) the resist pattern formed by the resist pattern forming step.

The method of etching is not particularly limited, and can be appropriately selected from among known methods in accordance with the object. Dry etching is a suitable example. The etching conditions are not particularly limited, and can be appropriately selected in accordance with the object.

Suitable examples of other steps are a surfactant coating step, a developing processing step, and the like.

The surfactant coating step is a step of coating a surfactant solution on the surface of the resist pattern to be thickened.

The surfactant is not particularly limited, and can be appropriately selected in accordance with the object. Suitable examples are the surfactants listed above, and polyoxyethylene-polyoxypropylene condensation product compounds, polyoxyalkylene alkylether compounds, polyoxyethylene alkylether compounds, polyoxyethylene derivative compounds, sorbitan fatty acid ester compounds, glycerin fatty acid ester compounds, primary alcohol ethoxylate compounds, phenol ethoxylate compounds, and nonylphenol ethoxylate, octylphenol ethoxylate, lauryl alcohol ethoxylate, oleyl alcohol ethoxylate, fatty acid ester, amide, natural alcohol, ethylene diamine, secondary alcohol ethoxylate, alkyl cationic, amide quaternary cationic, ester quaternary cationic, amine oxide, and betaine surfactants, and the like.

The developing processing step is to be applied after the resist pattern thickening material is applied. Note that the developing processing is as described previously.

By using the process for manufacturing a semiconductor device of the present invention, it is possible to efficiently fabricate various types of semiconductor devices such as flash memories, DRAMs, FRAMs, and the like.

Hereinafter, Examples of the present invention will be concretely described. However, the present invention is not in any way limited to these Examples.

EXAMPLE 1

—Preparation of Resist Pattern Thickening Material—

Resist pattern thickening materials A-I of the present invention having the compositions shown in Table 1 were prepared. Note that, in Table 1, the unit of the values in. parentheses is parts by mass. In the "resin" column, "KW-3" is a polyvinyl acetal resin (manufactured by Sekisui Chemical Co., Ltd.). In the "phase transfer catalyst" column, "tetramethylammonium acetate", "tetrabutylammonium acetate" and "tetramethylammonium chloride" are obtainable from Sigma-Aldrich Corporation. In the "crosslinking agent" column, "uril" denotes tetramethoxymethylglycol uril. In the "surfactant" column, "PC-6" is a non-ionic surfactant (a polykaryotic phenol surfactant manufactured by Asahi Denka Co, Ltd.) and "TN-80" is a non-ionic surfactant (a primary alcohol ethoxylate surfactant manufactured by Asahi Denka Co., Ltd.). Further, a mixed liquid of pure water (deionized water) and isopropyl alcohol (whose mass ratio was water (deionized water):isopropyl alcohol=98.6:0.4) was used as the main solvent component other than the resin.

TABLE 1

| THICKENING MATERIAL | RESIN | PHASE TRANSFER CATALYST | CROSSLINKING AGENT | CYCLIC STRUCTURE-CONTAINING COMPOUND | SURFACTANT |
|---|---|---|---|---|---|
| A | KW-3 (16) | tetramethylammonium acetate (0.2) | — | — | — |
| B | KW-3 (16) | tetramethylammonium acetate (0.2) | uril (1.16) | — | — |
| C | KW-3 (16) | tetramethylammonium acetate (0.2) | uril (1.16) | — | PC-6(0.1) |
| D | KW-3 (16) | — | uril (1.16) | — | PC-6(0.1) |
| E | KW-3 (16) | tetramethylammonium acetate (0.2) | uril (1.16) | catechin (5) | PC-6(0.1) |
| F | KW-3 (16) | tetramethylammonium acetate (0.2) | uril (1.16) | resorcinol (5) | PC-6(0.1) |
| G | KW-3 (16) | tetramethylammonium acetate (0.2) | uril (1.16) | — | TN-80(0.1) |
| H | KW-3 (16) | tetrabuthylammonium acetate (0.2) | uril (1.16) | — | PC-6(0.1) |
| I | KW-3 (16) | tetramethylammonium chloride (0.2) | uril (1.16) | — | PC-6(0.1) |

—Forming of Resist Pattern—

The resist pattern thickening materials A-I of the present invention which were prepared as described above were applied over isolated line patterns (width: 200 nm) formed by ArF resists (PAR700, manufactured by Sumitomo Chemical Co., Ltd.), by a spin coating method, first under the condition of 1,000 rpm/5 s, and then under the condition of 3,500 rpm/40 s. Thereafter, prebaking was carried out under the condition of 85° C./70 s, and then baking was carried out under the condition of 110° C./70 s. Thereafter, the resist pattern thickening materials A-I were rinsed for 60 seconds with pure water such that the portions which had not mixed were removed. By developing the resist patterns to be thickened which had been thickened by the resist pattern thickening materials A-I, resist patterns were prepared.

The sizes of the space patterns formed by the resist patterns are shown in Table 2 together with the initial pattern sizes (the sizes of the space patterns formed by the resist patterns to be thickened before thickening). Note that, in Table 2, "A" through "I" correspond to the resist pattern thickening materials A through I.

TABLE 2

| THICKENING MATERIAL | INITIAL PATTERN SIZE (nm) | PATTERN SIZE (nm) AFTER PROCESSING |
|---|---|---|
| A | 130.5 | 120.2 |
| B | 133.3 | 105.2 |
| C | 131.8 | 75.9 |
| D | 130.7 | 110.4 |
| E | 132.6 | 82.7 |
| F | 129.9 | 83.3 |
| G | 130.8 | 90.1 |
| H | 131.8 | 86.7 |
| I | 130.2 | 95.1 |

The resist pattern thickening materials A through D of the present invention which were prepared as described above were applied over various line-and-space patterns formed by the ArF resist (AX5910, manufactured by Sumitomo Chemical Co., Ltd.), by a spin coating method, first under the condition of 1,000 rpm/5 s, and then under the condition of 3,500 rpm/40 s. Thereafter, baking was carried out under the condition of 95° C./60 s. Thereafter, developing was carried out on the line-and-space patterns which had been thickened by the resist pattern thickening materials A through D, by rinsing the resist pattern thickening materials A through D for 60 seconds with pure water so that the uncrosslinked portions were removed. Thus, thickened resist patterns were prepared.

The sizes of the space patterns formed by the prepared thickened resist patterns are shown in Table 3 together with the initial pattern sizes (the sizes of the space patterns formed by the resist patterns before thickening). Note that, in Table 3, "A" through "D" correspond to the resist pattern thickening materials A through D.

TABLE 3

| | | RESIST PATTERN THICKENING MATERIAL | | | |
|---|---|---|---|---|---|
| | | REDUCED AMOUNT BY MATERIAL A (nm) | REDUCED AMOUNT BY MATERIAL B (nm) | REDUCED AMOUNT BY MATERIAL C (nm) | REDUCED AMOUNT BY MATERIAL D (nm) |
| INITIAL PATTERN SIZE (nm) | 130 (nm) | 4.6 | 12.8 | 42.9 | 22.3 |
| | 180 (nm) | 5.6 | 12.8 | 45.3 | 30.5 |
| | 250 (nm) | 5.5 | 13.9 | 43.6 | 48.2 |
| | 300 (nm) | 6.2 | 14.8 | 47.6 | 57.4 |
| | 500 (nm) | 7.5 | 16.8 | 46.3 | 60.8 |

It can be understood that the resist pattern thickening materials of the present invention can be applied to both a hole pattern and a line-and-space pattern, and in both cases, can, regardless of the material of the resist pattern to be thickened, thicken a resist pattern to be thickened uniformly in a state in which the edge roughness is improved. When the resist pattern thickening materials of the present invention are used in forming a hole pattern, the inner diameter of the hole pattern can be made to be narrow and fine. Further, when the resist pattern thickening materials of the present invention are used in forming a line-and-space pattern, the space widths (the intervals between the line patterns) in the line-and-space pattern can be made to be small and fine.

It was also found that the resist pattern thickening materials A-C of the present invention has less tendency to be affected by the size of initial pattern compared to the resist pattern thickening material D as a comparative example. The resist pattern thickening materials A-C of the present invention was enable to uniformly thicken the resist pattern and uniformly reduce the size of space pattern regardless of a size of the initial pattern. Namely, the resist pattern thickening materials of the present invention did not have a dependency to a size of the initial pattern.

This example was repeated provided that a resist pattern formed by using a polymethyl methacrylate without an acid generator is used, and the similar results as in above were obtained.

Next, the resist pattern thickening materials C, E, and F of the present invention were applied over the surfaces of resists formed on silicon substrates, and surface layers having a thickness of 0.5 μm were formed. Etching was carried out for three minutes under the conditions of Pμ=200 W, pressure=0.02 Torr, $CF_4$ gas=100 sccm by using an etching device (a parallel plate type RIE device manufactured by Fujitsu Ltd.), on the surface layers, and on a KrF resist (UV-6 manufactured by Shipley Company, L.L.C.) for comparison, and on polymethyl methacrylate (PMMA) for comparison. The amounts of film reduction of the samples were measured, the etching rates were calculated, and relative evaluation was carried out by using the etching rate of the KrF resist as the standard.

TABLE 4

| MATERIAL | ETCHING RATE (nm/min) | RATIO OF RATE |
|---|---|---|
| UV-6 | 625 | 1.00 |
| PMMA | 770 | 1.23 |
| C | 644 | 1.03 |
| E | 613 | 0.98 |
| F | 594 | 0.95 |

From the results of Table 4, it can be understood that the etching resistances of the resist pattern thickening materials of the present invention were near to that of the KrF resist and were markedly superior as compared with PMMA, since the resist pattern thickening materials of the present invention comprise a phase transfer catalyst.

—Preparation of Resist Pattern Thickening Material—

Resist pattern thickening materials 1 through 6 of the present invention having the compositions shown in Table 5 were prepared. Note that, in Table 5, "1" through "6" correspond to the resist pattern thickening materials 1 through 6, and the unit of the values in parentheses is parts by mass, excluding the unit in the "phase transfer catalyst" column. In the "resin" column, "KW-3" is a polyvinyl acetal resin (manufactured by Sekisui Chemical Co., Ltd.). Note that, in the resist pattern thickening material 4, polyvinyl β-resorcinol acetal resin (acetalization ratio 20.6 mol %) synthesized the method disclosed in JP-A 2004-46060 was used instead of "KW-3". In the "phase transfer catalyst" column, "tetramethylammonium acetate (TMAA)" is manufactured from Sigma-Aldrich Corporation. In the "cyclic structure-containing compound" column, the listed are used cyclic structure-containing compounds. In "organic solvent" column, "IPA" is isopropyl alcohol, "GBL" is γ-butyrolactone, and "PGME" is propyleneglycol methylether. In the "surfactant" column, "PC-6" is a non-ionic surfactant (a polykaryotic phenol ethoxylate surfactant manufactured by Asahi Denka Co, Ltd.). Further, a mixed liquid of pure water (deionized water) and the organic solvent shown in Table 5 (whose mass ratio was water (deionized water):the organic solvent shown in Table 5=98.6:the amount shown in Table 5) was used as the main solvent component other than the resin, phase transfer catalyst, and cyclic structure-containing compound.

TABLE 5

| THICKENING MATERIAL | RESIN | PHASE TRANSFER CATALYST | CYCLIC STRUCTURE-CONTAINING COMPOUND | ORGANIC SOLVENT | SURFACTANT |
|---|---|---|---|---|---|
| 1 | KW-3 (16) | tetramethylammonium acetate (1,000 ppm) | — | — | PC-6(0.1) |
| 2 | KW-3 (16) | tetramethylammonium acetate (2,000 ppm) | resorcinol (5) | IPA (5) | — |
| 3 | KW-3 (16) | tetramethylammonium acetate (2,000 ppm) | catechin (5) | IPA (5) | — |
| 4 | KW-3 (16) | tetramethylammonium acetate (2,000 ppm) | — | IPA (0.4) | — |
| 5 | KW-3 (16) | tetramethylammonium acetate (1,000 ppm) | — | GBL (0.4) | — |
| 6 | KW-3 (16) | tetramethylammonium acetate (1,000 ppm) | — | PGME (0.5) | — |

—Forming of Resist Pattern—

The resist pattern thickening materials 1 through 6 of the present invention which were prepared as described above were applied over hole patterns (diameter: 200 nm) formed by the ArF resist (PAR700, manufactured by Sumitomo Chemical Co., Ltd.), by a spin coating method, first under the condition of 1,000 rpm/5 s, and then under the condition of 3,500 rpm/40 s. Thereafter, prebaking was carried out under the condition of 85° C./70 s, and then baking was carried out under the condition of 110° C./70 s. Thereafter, the resist pattern thickening materials 1 through 6 were rinsed for 60 seconds with pure water such that the portions which had not mixed were removed. By developing the resist patterns to be thickened which had been thickened by the resist pattern thickening materials 1 though 6, resist patterns were prepared.

The sizes of the space patterns formed by the resist patterns are shown in Table 6 together with the initial pattern sizes (the sizes of the space patterns formed by the resist patterns to be thickened before thickening) Note that, in Table 6, "1" through "6" correspond to the resist pattern thickening materials 1 through 6.

TABLE 6

| THICKENING MATERIAL | INITIAL PATTERN SIZE (nm) | PATTERN SIZE (nm) AFTER PROCESSING |
|---|---|---|
| 1 | 131.3 | 120.8 |
| 2 | 130.1 | 122.3 |
| 3 | 132.1 | 119.8 |
| 4 | 129.5 | 117.4 |
| 5 | 128.9 | 125.1 |
| 6 | 131.8 | 123.3 |

The resist pattern thickening materials 1 through 6 of the present invention which were prepared as described above were applied over various line-and-space patterns formed by the ArF resist (AX5910, manufactured by Sumitomo Chemical Co., Ltd.), by a spin coated, first under the condition of 1,000 rpm/5 s, and then under the condition of 3,500 rpm/40 s. Thereafter, baking was carried out under the condition of 95° C./60 s. Thereafter, developing was carried out on the line-and-space patterns which had been thickened by the resist pattern thickening materials A through D, by rinsing the resist pattern thickening materials A through D for 60 seconds with pure water so that the uncrosslinked portions were removed. Thus, thickened resist patterns were prepared.

The sizes of the space patterns formed by the prepared thickened resist patterns are shown in Table 7 together with the initial pattern sizes (the sizes of the space patterns formed by the resist patterns before thickening). Note that, in Table 7, "material 1" through "material 6" correspond to the reduced amounts of the space patterns by the resist pattern thickening materials 1 through 6.

It was found that the resist pattern thickening materials 1-6 of the present invention did not have a dependency to the size of initial pattern, and was able to uniformly thicken the resist pattern and uniformly reduce the size of space pattern regardless of the size of initial pattern.

This example was repeated provided that a resist pattern formed of polymethyl methacrylate without an acid generator was used, and then the similar result was obtained.

Next, the resist pattern thickening materials I-XII were prepared by mixing 16 parts by mass of polyvinyl acetal as a resin, 1.35 parts by mass of uril as a crosslinking agent, 99 parts by mass of a mixed liquid of pure water and IPA (mass ratio of pure water/IPA: 98.6/0.4) as a solvent, 0.29 parts by mass of PC-6 as a surfactant, and the phase transfer catalyst shown in Table 8.

The resist pattern thickening materials I-XII of the present invention which were prepared as described above were applied over various line-and-space patterns formed by the ArF resist (AX5910, manufactured by Sumitomo Chemical Co., Ltd.), by a spin coating method, first under the condition of 1,000 rpm/5 s, and then under the condition of 3,500 rpm/40 s. Thereafter, baking was carried out under the condition of 95° C./60 s. Thereafter, developing was carried out on the line-and-space patterns which had been thickened by the resist pattern thickening materials I-XII, by rinsing the resist pattern thickening materials I-XII for 60 seconds with pure water so that the uncrosslinked portions were removed. Thus, thickened resist patterns were prepared.

The sizes of the space patterns formed by the prepared thickened resist patterns are shown in Table 9 together with the initial pattern sizes (the sizes of the space patterns formed by the resist patterns before thickening). Note that, in Table 8, "I" through "XII" correspond to the resist pattern thickening materials I through XII, and in Table 9, "I" through "XII" correspond to the reduced amounts of the space patterns by the resist pattern thickening materials I through XII. In Table 8, "tetramethylammoniumacetate" and "tetrabutylammoniumacetate" are manufactured by Tokyo Kasei Kogyo Co. Ltd.

TABLE 8

| RESIST PATTERN THICKENING MATERIAL | PHASE TRANSFER CATALYST |
|---|---|
| I | tetramethylammoniumacetate (100 ppm) |
| II | tetramethylammoniumacetate (1,000 ppm) |
| III | tetramethylammoniumacetate (2,000 ppm) |
| IV | tetramethylammoniumacetate (5,000 ppm) |
| V | tetramethylammoniumacetate (10,000 ppm) |
| VI | tetramethylammoniumacetate (50,000 ppm) |
| VII | tetrabuthylammoniumacetate (100 ppm) |
| VIII | tetrabuthylammoniumacetate (1,000 ppm) |
| IX | tetrabuthylammoniumacetate (2,000 ppm) |
| X | tetrabuthylammoniumacetate (5,000 ppm) |
| XI | tetrabuthylammoniumacetate (10,000 ppm) |
| XII | tetrabuthylammoniumacetate (50,000 ppm) |

TABLE 7

| | | RESIST PATTERN THICKENING MATERIAL | | | | | |
|---|---|---|---|---|---|---|---|
| | | MATERIAL 1 (nm) | MATERIAL 2 (nm) | MATERIAL 3 (nm) | MATERIAL 4 (nm) | MATERIAL 5 (nm) | MATERIAL 6 (nm) |
| INITIAL PATTERN SIZE (nm) | 130 (nm) | 8.6 | 12.2 | 13.2 | 10.9 | 7.1 | 7.8 |
| | 180 (nm) | 10.1 | 14.5 | 14.8 | 13.0 | 8.2 | 8.3 |
| | 250 (nm) | 11.5 | 16.8 | 18.0 | 15.1 | 9.6 | 10.0 |
| | 300 (nm) | 12.4 | 19.5 | 21.4 | 17.1 | 10.5 | 12.1 |
| | 500 (nm) | 13.5 | 20.5 | 22.1 | 19.9 | 12.5 | 13.4 |

TABLE 9

| | | RESIST PATTERN THICKENING MATERIAL | | | | | | | | | | |
|---|---|---|---|---|---|---|---|---|---|---|---|---|
| | | I (nm) | II (nm) | III (nm) | IV (nm) | V (nm) | VI (nm) | VII (nm) | VIII (nm) | IX (nm) | X (nm) | XI (nm) | XII (nm) |
| Initial pattern size (nm) | 130 (nm) | 39.8 | 38.2 | 36.8 | 36.8 | 33.1 | * | 39.2 | 35.6 | 35.4 | 36.0 | 344 | * |
| | 180 (nm) | 45.1 | 39.5 | 37.3 | 37.1 | 38.5 | * | 42.3 | 39.1 | 38.6 | 40.5 | 42.7 | * |
| | 250 (nm) | 52.6 | 42.1 | 39.6 | 43.5 | 40.1 | * | 54.9 | 44.4 | 42.0 | 52.1 | 55.1 | * |
| | 300 (nm) | 66.7 | 43.8 | 40.4 | 55.5 | 46.7 | * | 68.0 | 48.6 | 46.0 | 60.3 | 66.7 | * |
| | 500 (nm) | 83.1 | 58.2 | 43.2 | 87.5 | 67.6 | * | 89.5 | 68.7 | 59.1 | 90.2 | 97.8 | * |

As can be seen in Table 9, it was found that the surface of resist pattern, in any case of initial pattern size being 130 nm, 180 nm, 250 nm, 300 nm, or 500 nm, became irregular when it was thickened by using the resist pattern thickening materials IV, V, and XI.

When the content of phase transfer catalyst, i.e., tetramethylammoniumacetate or tetrabutylammoniumacetate, is 10,000 ppm or less, the resist pattern thickening material is enable to uniformly thicken the resist pattern and uniformly reduce the size of space pattern, free from dissolving the resist pattern, and not affected by the size of the initial pattern.

EXAMPLE 2

Figure 9:
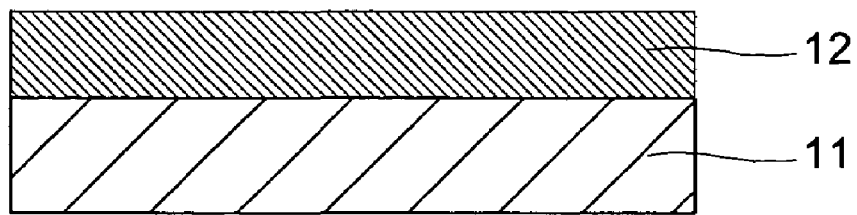
FIG. 9 is a schematic diagram for explaining an example of a process for manufacturing a semiconductor device of the present invention, and showing the state where an interlayer insulating film is formed on a silicon substrate.
Figure 10:
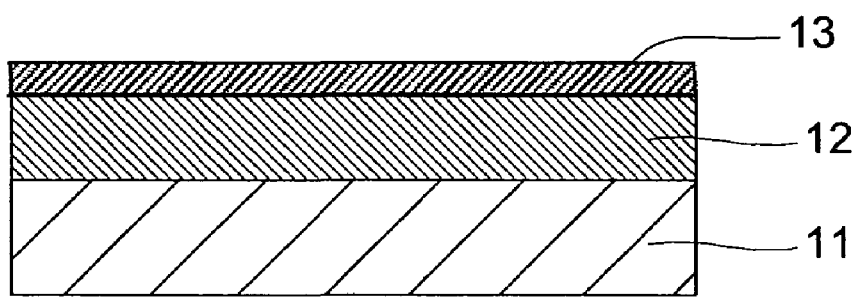
FIG. 10 is a schematic diagram for explaining an example of a process for manufacturing a semiconductor device of the present invention, and showing the state where a titan film is formed on the interlayer insulating film.
Figure 11:
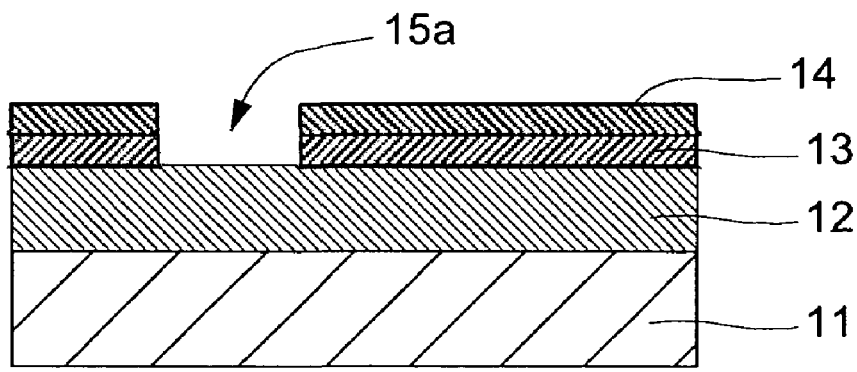
FIG. 11 is a schematic diagram for explaining an example of a process for manufacturing a semiconductor device of the present invention, and showing the state where a resist film is formed on the titan film and a hole pattern is formed on the titan film.
Figure 12:
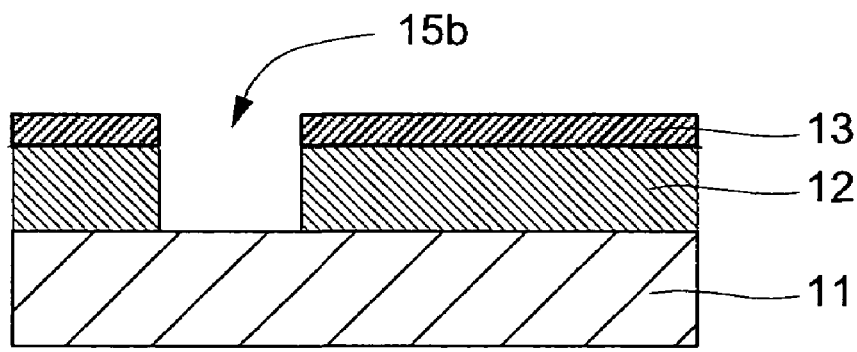
FIG. 12 is a schematic diagram for explaining an example of a process for manufacturing a semiconductor device of the present invention, and showing the state where the hole pattern is also formed on the titan film.

As shown in FIG. 9, an interlayer insulating film 12 was formed on a silicon substrate 11. As shown in FIG. 10, a titanium film 13 was formed by a sputtering method on the interlayer insulating film 12. Next, as shown in FIG. 11, a resist pattern 14 was formed. By using the resist pattern 14 as a mask, the titanium film 13 was patterned by reactive ion etching such that openings 15a were formed. Subsequently, as shown in FIG. 12, the resist pattern 14 was removed by reactive ion etching, and openings 15b were formed in the interlayer insulating film 12 by using the titanium film 13 as a mask.

Figure 13:
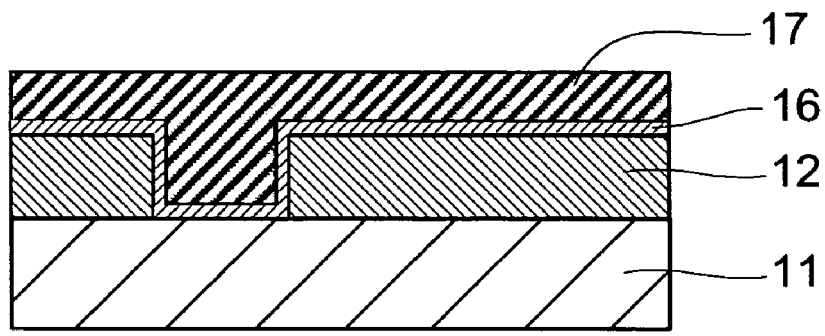
FIG. 13 is a schematic diagram for explaining an example of a process for manufacturing a semiconductor device of the present invention, and showing the state where a copper film is formed on the interlayer insulating film having the hole pattern.
Figure 14:
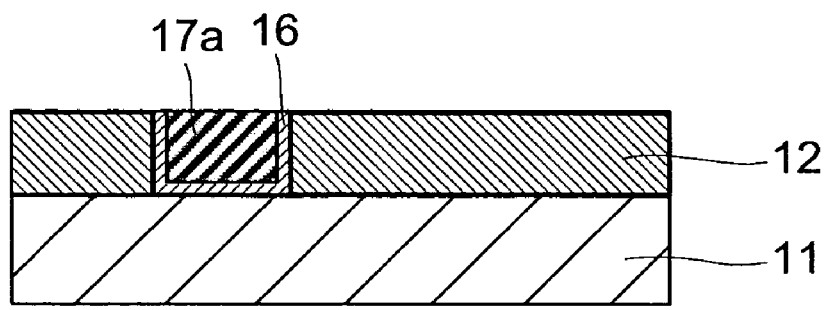
FIG. 14 is a schematic diagram for explaining an example of a process for manufacturing a semiconductor device of the present invention, and showing the state where the copper is removed except the layer on the hole pattern of the interlayer insulating film.

Next, the titanium film 13 was removed by wet processing, and as shown in FIG. 13, a TiN film 16 was formed on the interlayer insulating film 12 by a sputtering method. Subsequently, a Cu film 17 was grown by an electrolytic plating method on the TiN film 16. Next, as shown in FIG. 14, planarizing was carried out by CMP such that the barrier metal and the Cu film (first metal film) remained only in the groove portions corresponding to the openings 15b (FIG. 12), and wires 17a of a first layer were formed.

Figure 15:
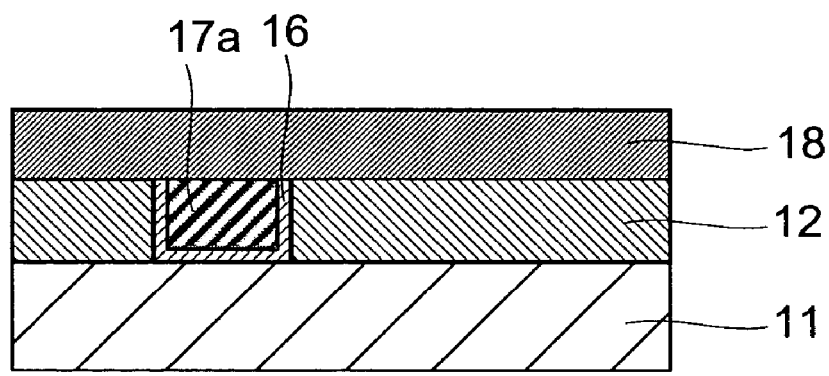
FIG. 15 is a schematic diagram for explaining an example of a process for manufacturing a semiconductor device of the present invention, and showing the state where an interlayer insulating film is formed on the copper plug formed inside of the hole pattern, and on the interlayer insulating film.
Figure 16:
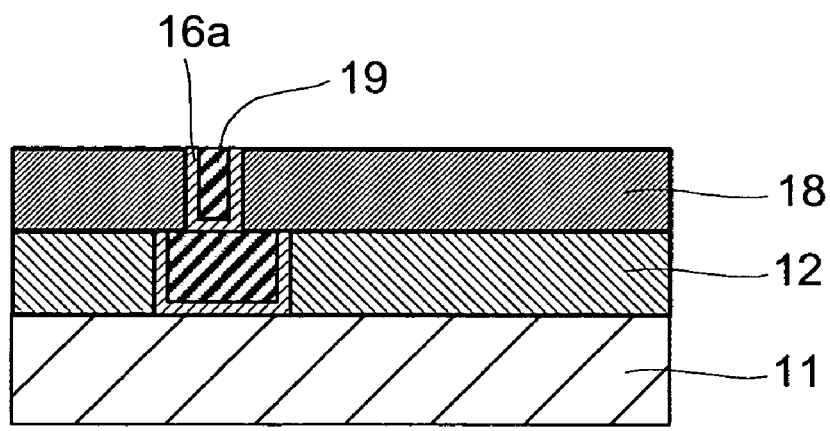
FIG. 16 is a schematic diagram for explaining an example of a process for manufacturing a semiconductor device of the present invention, and showing the state where a hole pattern is formed on the interlayer insulating film as a surface layer and a copper plug is formed therein.

Next, as shown in FIG. 15, an interlayer insulating film 18 was formed on the wires 17a of the first layer. Thereafter, in the same way as in FIGS. 9 through 14, Cu plugs (second metal films) 19 and TiN films 16a, which connected the wires 17a of the first layer to upper layer wires which would be formed later, were formed as shown in FIG. 16.

Figure 17:
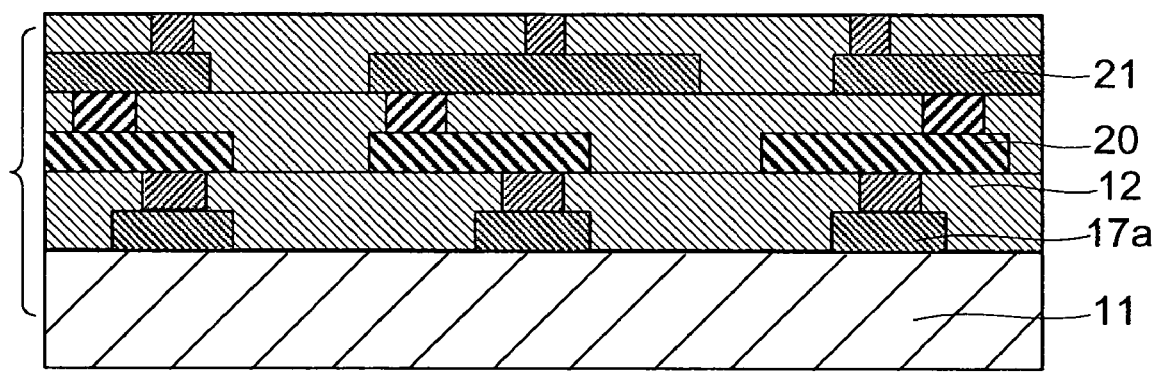
FIG. 17 is a schematic diagram for explaining an example of a process for manufacturing a semiconductor device of the present invention, and showing the state where a three-layered wiring is formed.

By repeating the above-described respective processes, as shown in FIG. 17, a semiconductor device was fabricated which had a multilayer wiring structure having, on the silicon substrate 11, the wires 17a of the first layer, wires 20 of a second layer, and wires 21 of a third layer. Note that the barrier metal layers formed beneath the wires of the respective layers are not shown in FIG. 17.

In present Example 2, the resist pattern 14 is a resist pattern fabricated in the same way as in the case of Example 1, by using the resist pattern thickening material of the present invention.

EXAMPLE 3

—Flash Memory and Process for Manufacturing thereof—

Example 3 is an example of the semiconductor device and process for manufacturing thereof of the present invention using the resist pattern thickening material of the present invention. Note that, in Example 3, resist films 26, 27, 29, and 32 which will be described hereinafter are resist films which have been thickened by the same process as in Examples 1 and 2 by using the resist pattern thickening material of the present invention.

Figure 18:
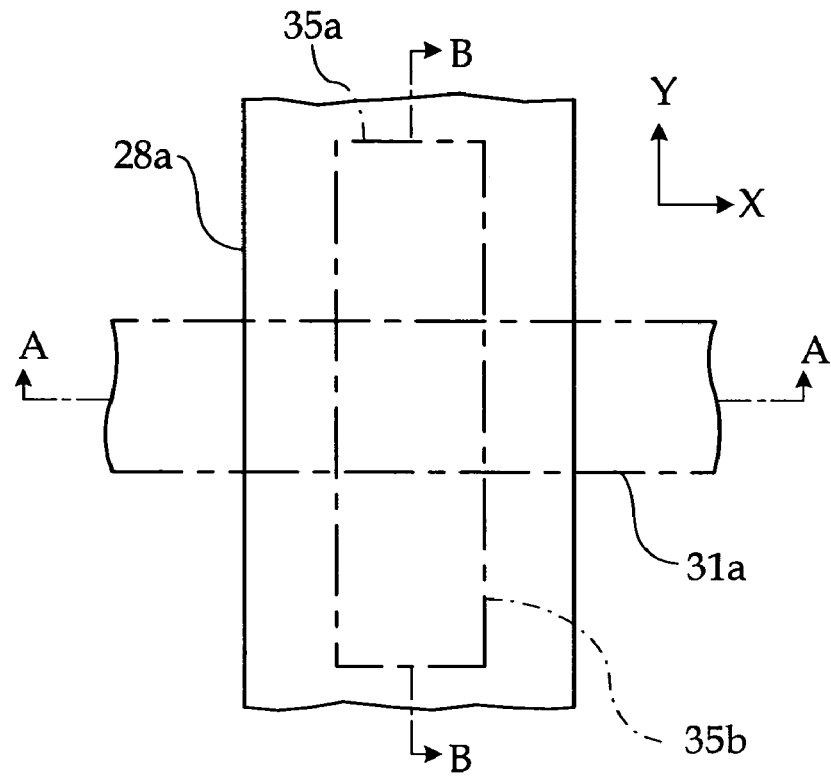
FIG. 18 is a top view for explaining a FLASH EPROM which is one example of a semiconductor device of the present invention.
Figure 19:
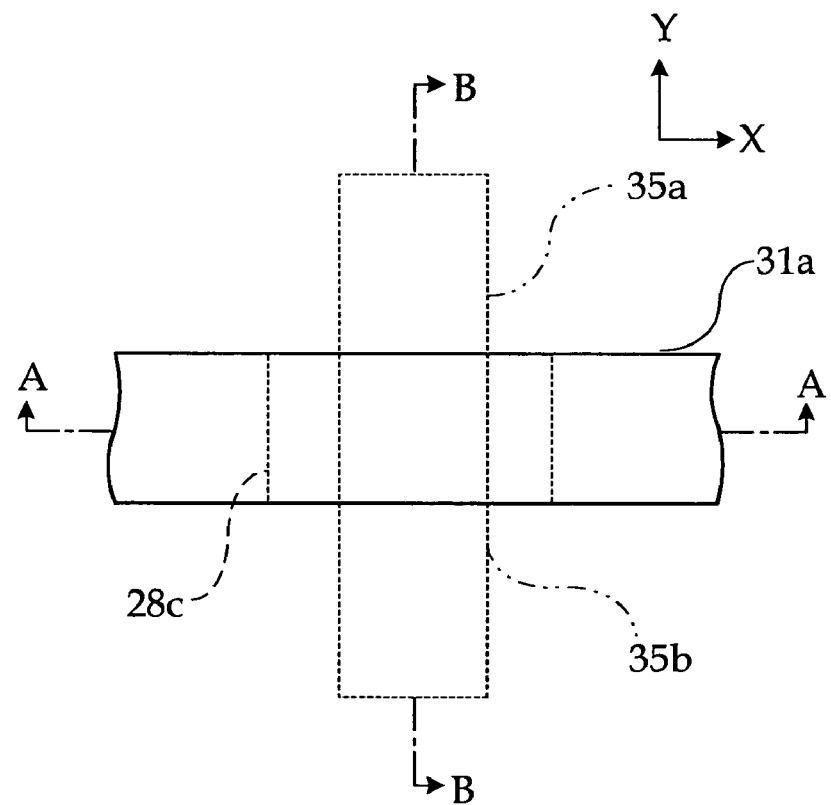
FIG. 19 is a top view for explaining a FLASH EPROM which is another example of a semiconductor device of the present invention.

FIGS. 18 and 19 are top views (plan views) of a FLASH EPROM which is called a FLOTOX type or an ETOX type. Note that FIGS. 20 through 28 are cross-sectional schematic views for explaining an example of a process for manufacturing the FLASH EPROM. In FIGS. 20 through 28, the illustrations at the left sides are a memory cell portion (a first element region), and are schematic diagrams of the cross-section (the A direction cross-section) of the gate widthwise direction (the X direction in FIGS. 18 and 19) of the portion at which a MOS transistor having a floating gate electrode is formed. The illustrations at the center are the memory cell portion, which is the same portion as in the left side drawings, and are schematic diagrams of the cross-section (the B direction cross-section) of the gate lengthwise direction (the Y direction in FIGS. 18 and 19) which is orthogonal to the X direction. The illustrations at the right side are schematic diagrams of the cross-section (the A direction cross-section in FIGS. 18 and 19) of the portion of the peripheral circuit portion (a second element region) at which a MOS transistor is formed.

Figures 20, 21, 22:
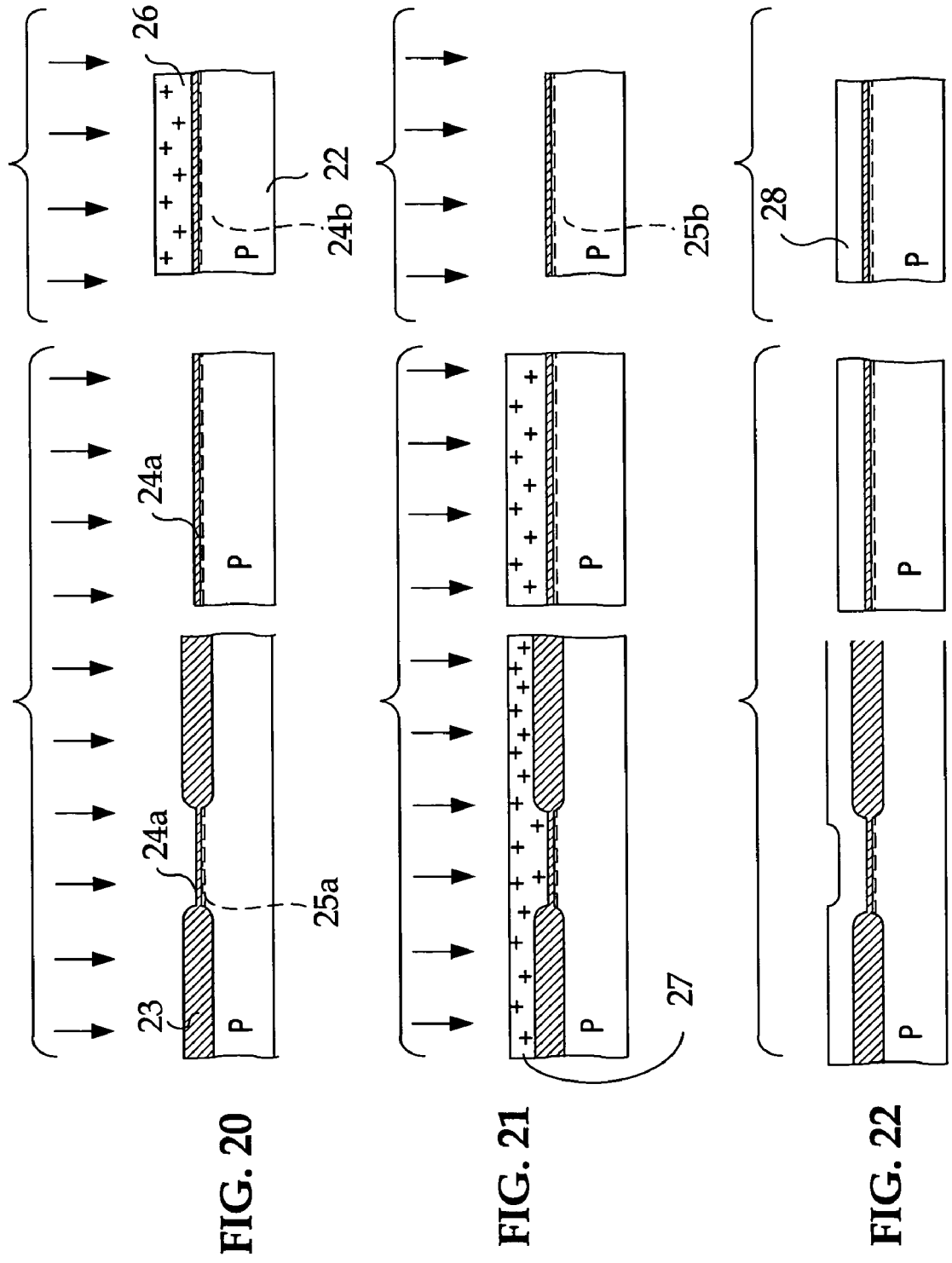
FIG. 20 is a cross-sectional schematic diagram for explaining a process for manufacturing the FLASH EPROM which is an example of the process for manufacturing a semiconductor device of the present invention.
FIG. 21 is a cross-sectional schematic diagram for explaining a process for manufacturing the FLASH EPROM which is an example of the process for manufacturing a semiconductor device of the present invention, and showing a step after the step shown in FIG. 20.
FIG. 22 is a cross-sectional schematic diagram for explaining a process for manufacturing the FLASH EPROM which is an example of the process for manufacturing a semiconductor device of the present invention, and showing a step after the step shown in FIG. 21.

First, as shown in FIG. 20, a field oxide film 23 of $SiO_2$ was selectively formed at the element isolation region on a p type Si substrate 22. Thereafter, a first gate insulating film 24a was formed at the MOS transistor of the memory cell portion (the first element region), by an $SiO_2$ film by thermal oxidation so as to become a thickness of 10 nm (100 Å) to 30 nm (300 Å). In a separate process, a second gate insulating film 24b was formed at the MOS transistor of the peripheral circuit portion (the second element region), by an $SiO_2$ film by thermal oxidation so as to become a thickness of 10 nm (100 Å) to 50 nm (500 Å). Note that, when the first gate insulating film 24a and the second gate insulating film 24b are the same thickness, these oxide films may be formed simultaneously in the same process.

Next, in order to form a MOS transistor having depression type n-channels at the memory cell portion (the left side and the center in FIG. 20), the peripheral circuit portion (the right side in FIG. 20) was masked by a resist film 26 for the purpose of controlling the threshold voltage. Then, phosphorus (P) or arsenic (As) was introduced, as an n type impurity in a dosage amount of $1\times10^{11}$ cm$^{-2}$ to $1\times10^{14}$ cm$^{-2}$ by an ion implantation method, into the regions which were to become the channel regions directly beneath the floating gate electrodes, such that a first threshold value control layer 25a was formed. Note that the dosage amount and the conductive type of the impurity at this time can be appropriately selected in accordance with whether depression type channels or accumulation type channels are to be formed.

Next, in order to form a MOS transistor having depression type n-channels at the peripheral circuit portion (the right side in FIG. 21), the memory cell portion (the left side and the center in FIG. 21) was masked by the resist film 27 for the purpose of controlling the threshold voltage. Then, phosphorus (P) or arsenic (As) was introduced, as an n type impurity in a dosage amount of $1\times10^{11}$ cm$^{-2}$ to $1\times10^{14}$ cm$^{-2}$ by an ion implantation method, into the regions which were to become the channel regions directly beneath the gate electrodes, such that a second threshold value control layer 25b was formed.

Next, a first polysilicon film (a first conductor film) 28 having a thickness of 50 nm (500 Å) to 200 nm (2,000 Å) was applied over the entire surface as a floating gate electrode of the MOS transistor at the memory cell portion (the left side and the center in FIG. 22) and as a gate electrode of the MOS transistor at the peripheral circuit portion (the right side in FIG. 22).

Figures 23, 24, 25:
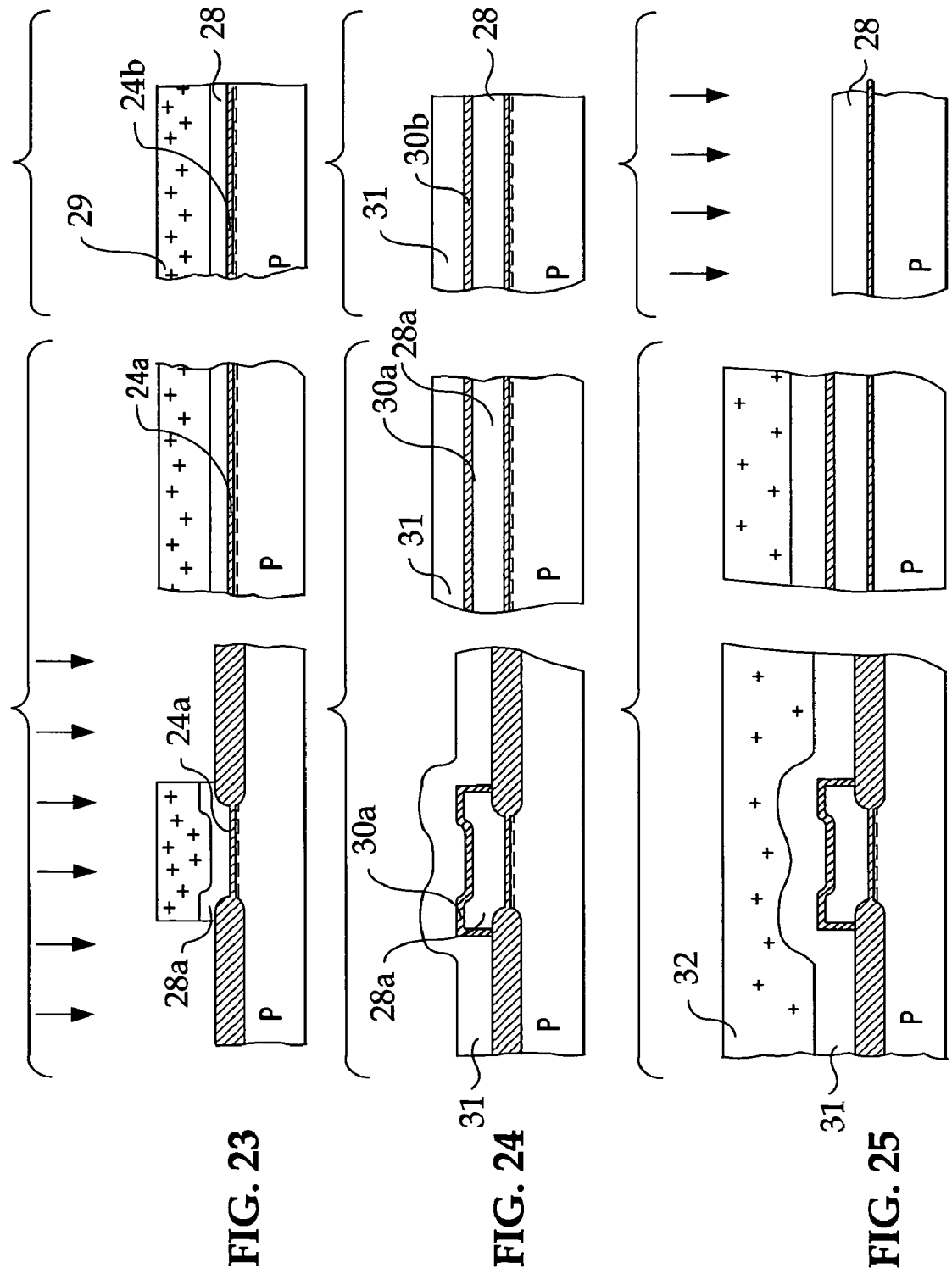
FIG. 23 is a cross-sectional schematic diagram for explaining a process for manufacturing the FLASH EPROM which is an example of the process for manufacturing a semiconductor device of the present invention, and showing a step after the step shown in FIG. 22.
FIG. 24 is a cross-sectional schematic diagram for explaining a process for manufacturing the FLASH EPROM which is an example of the process for manufacturing a semiconductor device of the present invention, and showing a step after the step shown in FIG. 23.
FIG. 25 is a cross-sectional schematic diagram for explaining a process for manufacturing the FLASH EPROM which is an example of the process for manufacturing a semiconductor device of the present invention, and showing a step after the step shown in FIG. 24.

Thereafter, as shown in FIG. 23, the first polysilicon film 28 was patterned by using a resist film 29 formed as a mask, such that a floating gate electrode 28a was formed at the MOS transistor at the memory cell portion (the left side and the center in FIG. 23). At this time, as shown in FIG. 23, in the X direction, patterning was carried out so as to obtain the final width, and in the Y direction, the region which was to become the S/D region layer remained covered by the resist film 29 without patterning.

Next, as shown in the left side and the center of FIG. 24, after the resist film 29 was removed, a capacitor insulating film 30a formed of an SiO$_2$ film was formed by thermal oxidation to a thickness of approximately of 20 nm (200 Å) to 50 nm (500 Å) so as to cover the floating gate electrode 28a. At this time, a capacitor insulating film 30b formed of an SiO$_2$ film was formed on the first polysilicon film 28 of the peripheral circuit portion (the right side in FIG. 24). Here, although the capacitor insulating films 30a and 30b were formed only by SiO$_2$ films, they may be formed by a composite film of two to three layers of SiO$_2$ and Si$_3$N$_4$ films.

Next, as shown in FIG. 24, a second polysilicon film (a second conductor film) 31, which was to become a control gate electrode, was formed to a thickness of 50 nm (500 Å) to 200 nm (2,000 Å) so as to cover the floating gate electrode 28a and the capacitor insulating film 30a.

Then, as shown in FIG. 25, the memory portion (the left side and the center of FIG. 25) was masked by a resist film 32, and the second polysilicon film 31 and the capacitor insulating film 30b of the peripheral circuit portion (the right side in FIG. 25) were successively removed by etching such that the first polysilicon film 28 was exposed at the surface.

Figure 26:
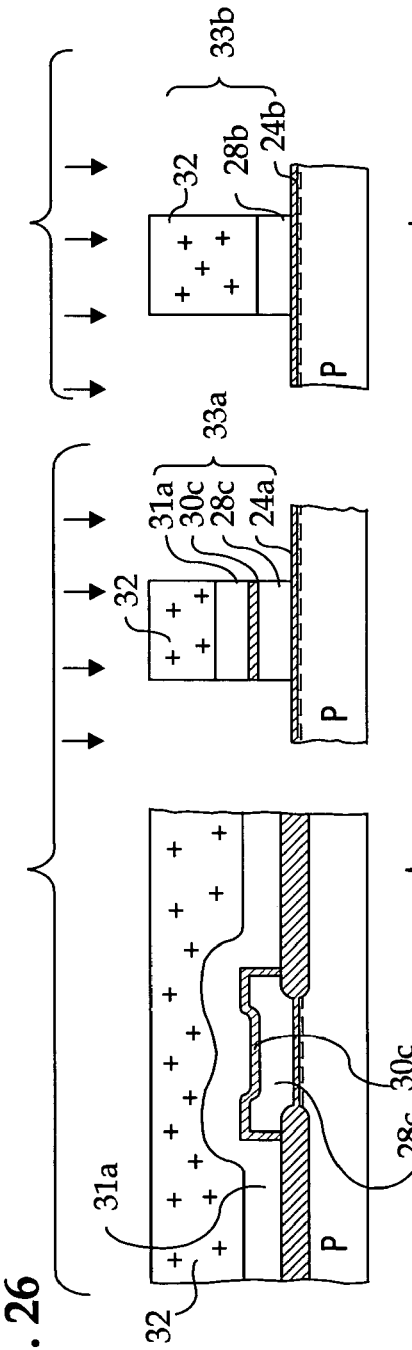
FIG. 26 is a cross-sectional schematic diagram for explaining a process for manufacturing the FLASH EPROM which is an example of the process for manufacturing a semiconductor device of the present invention, and showing a step after the step shown in FIG. 25.

Subsequently, as shown in FIG. 26, the second polysilicon film 31, the capacitor insulating film 30a and the first polysilicon film 28a which had been patterned only in the X direction, of the memory portion (the left side and the center of FIG. 26), were, by using the resist film 32 as a mask, subjected to patterning in the Y direction so as to become the final dimension of a first gate portion 33a. A laminate structure formed by a control gate electrode 31a/a capacitor insulating film 30c/a floating gate electrode 28c, which had a width of approximately 1 µm in the Y direction, was formed. The first polysilicon film 28 of the peripheral circuit portion (the left side in FIG. 26) was, by using the resist film 32 as a mask, subjected to patterning so as to become the final dimension of a second gate portion 33b, and a gate electrode 28b of a width of approximately 1 µm was formed.

Next, by using the laminate structure formed by the control gate electrode 31a/the capacitor insulating film 30c/the floating gate electrode 28c of the memory cell portion (the left side and the center of FIG. 27) as a mask, phosphorus (P) or arsenic (As) was introduced, in a dosage amount of $1\times10^{14}$ cm$^{-2}$ to $1\times10^{16}$ cm$^{-2}$ by an ion implantation method, into the Si substrate 22 of the element forming region, such that n type S/D region layers 35a and 35b were formed. By using the gate electrode 28b at the peripheral circuit portion (the right side of FIG. 27) as a mask, phosphorus (P) or arsenic (As) was introduced, as an n type impurity in a dosage amount of $1\times10^{14}$ cm$^{-2}$ to $1\times10^{16}$ cm$^{-2}$ by an ion implantation method, into the Si substrate 22 of the element forming region, such that S/D region layers 36a and 36b were formed.

Subsequently, the first gate portion 33a of the memory cell portion (the left side and the center of FIG. 28) and the second gate portion 33b of the peripheral circuit portion (the right side of FIG. 28) were covered by forming an interlayer insulating film 37 formed of a PSG film to a thickness of about 500 nm (5,000 Å).

Thereafter, contact holes 38a, 38b and contact holes 39a, 39b were formed in the interlayer insulating film 37 formed on the S/D region layers 35a, 35b and the S/D region layers 36a, 36b. Thereafter, S/D electrodes 40a, 40b and S/D electrodes 41a, 41b were formed. Here, to form the contact holes 38a, 38b, 39a and 39b, the hole pattern was formed with the resist material and then thickened the resist pattern with the resist pattern thickening material of the present invention, thereby forming fine space patterns (hole patterns). Thereafter, the contact holes were fabricated in accordance with a known method.

Figure 28:
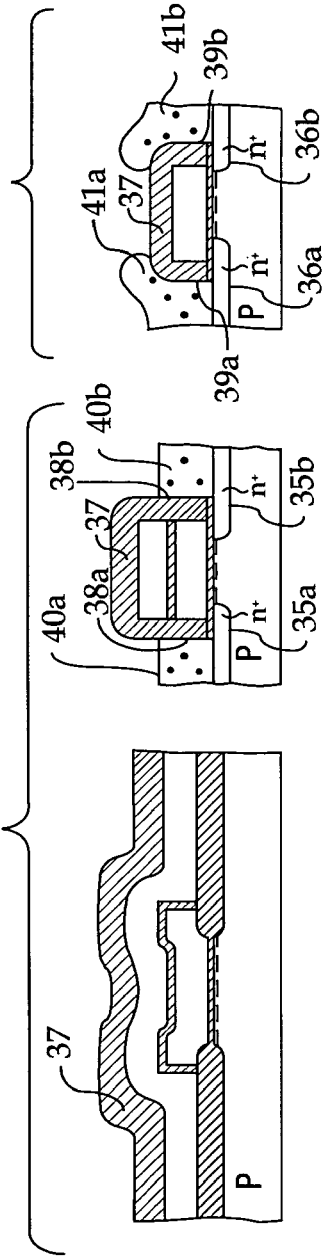
FIG. 28 is a cross-sectional schematic diagram for explaining a process for manufacturing the FLASH EPROM which is an example of the process for manufacturing a semiconductor device of the present invention, and showing a step after the step shown in FIG. 27.

In this way, as shown in FIG. 28, the FLASH EPROM was fabricated as a semiconductor device.

In this FLASH EPROM, the second gate insulating film 24b of the peripheral circuit portion (the right side in FIGS. 20 through 28) is covered (refer to the right side in FIGS. 20 through 28) by the first polysilicon film 28 or the gate electrode 28b always after formation. Thus, the second gate insulating film 24b is maintained at the thickness at which it was initially formed. Thus, it is easy to control the thickness of the second gate insulating film 24b, and easy to adjust the concentration of the conductive impurity in order to control the threshold voltage.

Note that, in the above-described example, in order to form the first gate portion 33a, first, patterning is carried out at a predetermined width in the gate widthwise direction (the X direction in FIGS. 18 and 19), and thereafter, patterning is carried out in the gate lengthwise direction (the Y direction in FIGS. 18 and 19) so as to attain the final predetermined width. However, conversely, patterning may be carried out at a predetermined width in the gate lengthwise direction (the Y direction in FIGS. 18 and 19), and thereafter, patterning may be carried out in the gate widthwise direction (the X direction in FIGS. 18 and 19) so as to attain the final predetermined width.

Figure 27:
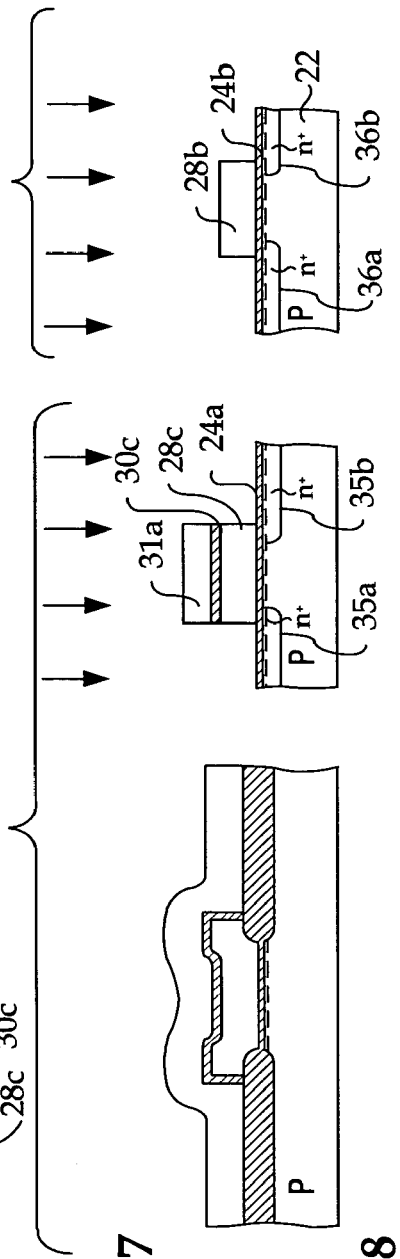
FIG. 27 is a cross-sectional schematic diagram for explaining a process for manufacturing the FLASH EPROM which is an example of the process for manufacturing a semiconductor device of the present invention, and showing a step after the step shown in FIG. 26.
Figure 29:
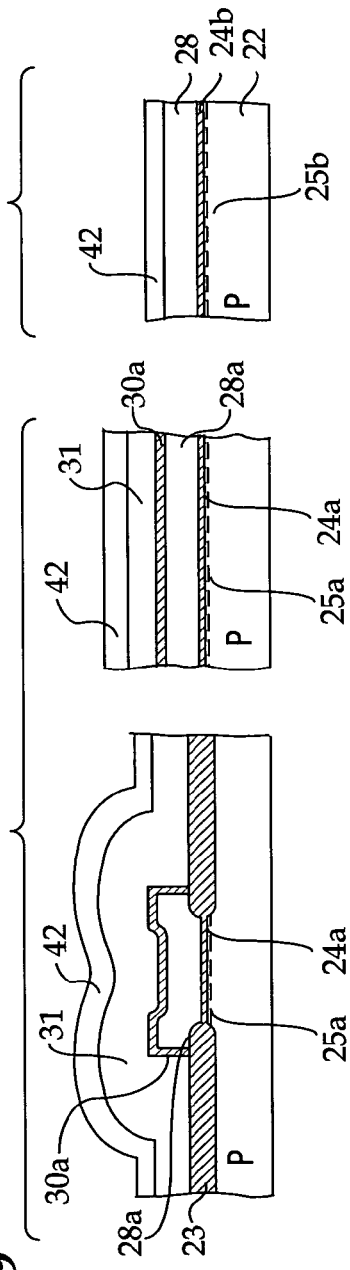
FIG. 29 is a cross-sectional schematic diagram for explaining the process for manufacturing the FLASH EPROM which is another example of the process for manufacturing a semiconductor device of the present invention.
Figure 30:
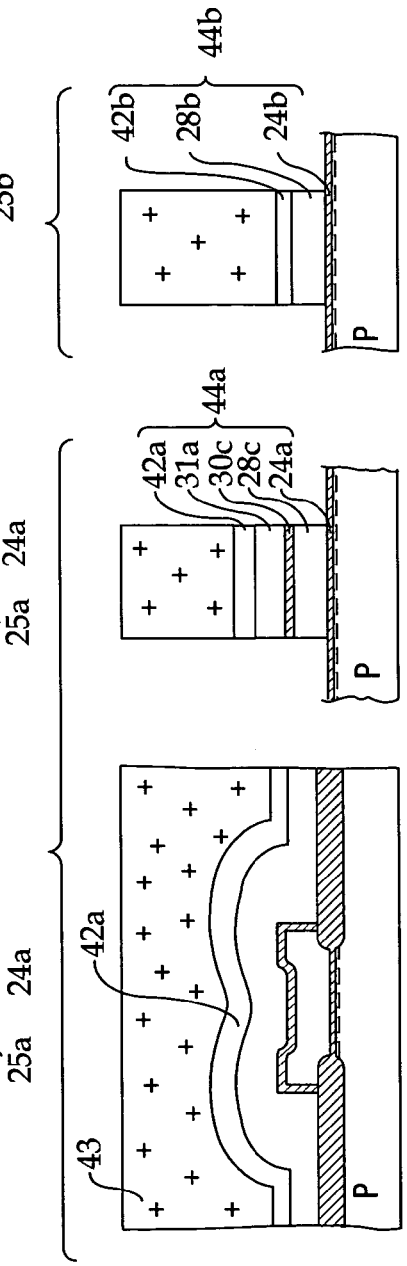
FIG. 30 is a cross-sectional schematic diagram for explaining the process for manufacturing the FLASH EPROM which is another example of the process for manufacturing a semiconductor device of the present invention, and showing a step after the step shown in FIG. 29.
Figure 31:
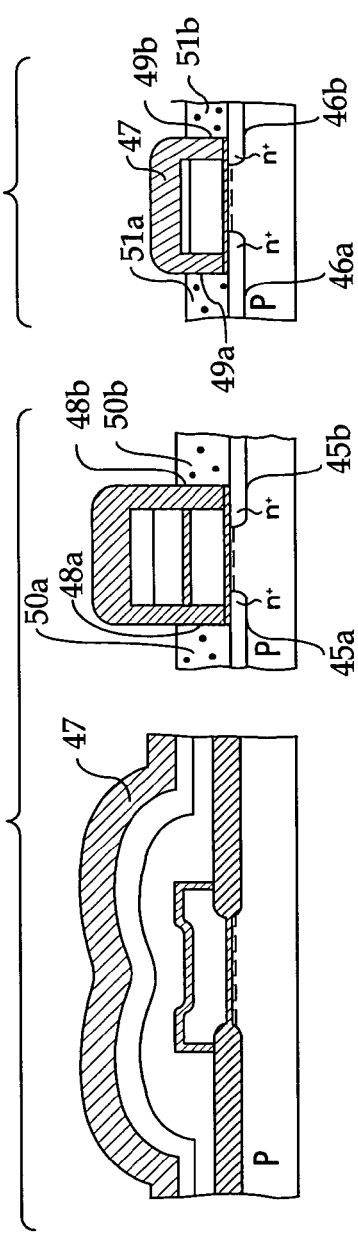
FIG. 31 is a cross-sectional schematic diagram for explaining the process for manufacturing the FLASH EPROM which is another example of the process for manufacturing a semiconductor device of the present invention, and showing a step after the step shown in FIG. 30.

The example of fabricating a FLASH EPROM shown in FIGS. 29 through 31 is the same as the above-described example, except that the processes after the process shown by FIG. 28 in the above example are changed to the processes shown in FIGS. 29 through 31. Namely, as shown in FIG. 29, this example differs from the above-described example only with respect to the point that a polycide film is provided by forming a high melting point metal film (a fourth conductor film) 42 formed of a tungsten (W) film or a titanium (Ti) film to a thickness of approximately 200 nm (2,000 Å), on the second polysilicon film 31 of the memory cell portion shown at the left side and the center of FIG. 29 and on the first polysilicon film 28 of the peripheral circuit portion shown at the right side in FIG. 29. The processes after FIG. 29, i.e., the processes shown in FIGS. 30 and 31, are the same as those shown in FIGS. 26 through 28. Explanation of the processes which are the same as those shown in FIGS. 26 through 28 is omitted. In FIGS. 29 through 31, portions which are the same as those in FIGS. 26 through 28 are denoted by the same reference numerals.

In this way, as shown in FIG. 31, the FLASH EPROM was fabricated as a semiconductor device.

In this FLASH EPROM, high melting point metal films (the fourth conductor films) 42a and 42b were formed on the control gate electrode 31a and the gate electrode 28b. Thus, the electrical resistance value could be decreased even more.

Note that, here, the high melting point metal films (the fourth conductor films) 42a and 42b were used as the high melting point metal film (the fourth conductor film). However, a high melting point metal silicide film such as a titanium silicide (TiSi) film or the like may be used.

Figure 32:
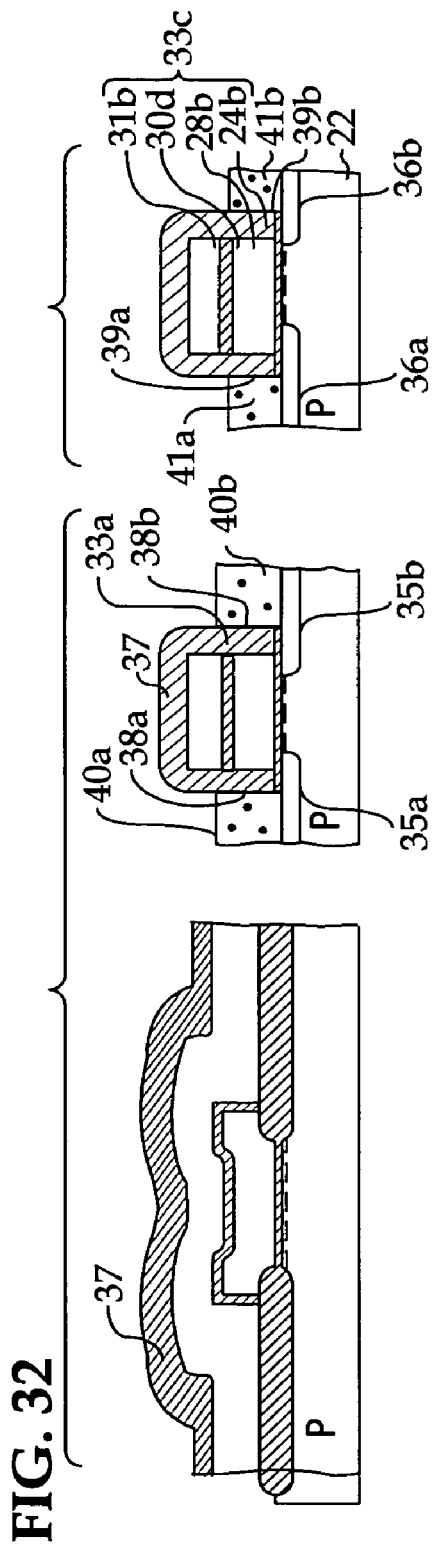
FIG. 32 is a cross-sectional schematic diagram for explaining the process for manufacturing the FLASH EPROM which is yet another example of the process for manufacturing a semiconductor device of the present invention.
Figure 33:
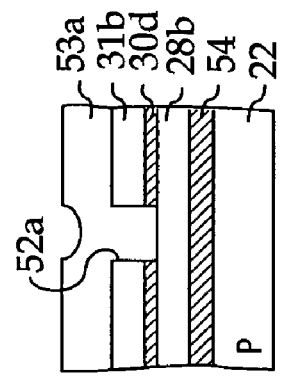
FIG. 33 is a cross-sectional schematic diagram for explaining the process for manufacturing the FLASH EPROM which is yet another example of the process for manufacturing a semiconductor device of the present invention, and showing a step after the step shown in FIG. 32.
Figure 34:
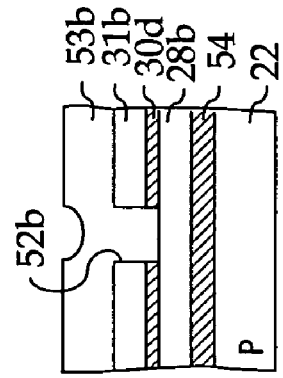
FIG. 34 is a cross-sectional schematic diagram for explaining the process for manufacturing the FLASH EPROM which is yet another example of the process for manufacturing a semiconductor device of the present invention, and showing a step after the step shown in FIG. 33.

The example of fabricating a FLASH EPROM shown in FIGS. 32 through 34 is the same as the above-described example, except that a second gate portion 33c of the peripheral circuit portion (the second element region) (the right side in FIG. 32) also has the structure of the first polysilicon film 28b (first conductor film)/an $SiO_2$ film 30d (capacitor insulating film)/a second polysilicon film 31b (second conductor film) in the same way as the first gate portion 33a of the memory cell portion (the first element region) (the left side and center in FIG. 32), and that the first polysilicon film 28b and the second polysilicon film 31b are short-circuited so as to form a gate electrode as shown in FIG. 33 or FIG. 34.

Here, as shown in FIG. 33, an opening 52a, which passes through the first polysilicon film 28b (first conductor film)/the $SiO_2$ film 30d (capacitor insulating film)/the second polysilicon film 31b (second conductor film), is formed at a different place than, for example, a second gate portion 33c shown in FIG. 32, e.g., on an insulating film 54. A third conductive film, for example, a high melting point metal film 53a such as a W film or a Ti film or the like, is filled in the opening 52a. The first polysilicon film 28b and the second polysilicon film 31b are thereby short-circuited. Or, as shown in FIG. 34, an opening 52b, which passes through the first polysilicon film 28b (first conductor film)/the $SiO_2$ film 30d (capacitor insulating film), is formed. The first polysilicon film 28b, the lower layer, is exposed at the bottom portion of the opening 52b. Thereafter, a third conductive film, for example, a high melting point metal film 53b such as a W film or a Ti film or the like, is filled in the opening 52b. The first polysilicon film 28b and the second polysilicon film 31b are thereby short-circuited.

In this FLASH EPROM, the second gate portion 33c of the peripheral circuit portion and the first gate portion 33a of the memory cell portion have the same structure. Thus, the peripheral circuit portion can be formed simultaneously with the formation of the memory cell portion. The fabricating process can thereby be simplified, which is efficient.

Note that, here, the third conductor film 53a or 53b was formed separately from the high melting point metal film (the fourth conductor film) 42. However, they may be formed simultaneously as a common high melting point metal film.

EXAMPLE 4

—Fabricating of Recording Head—

Example 4 relates to the fabricating of a recording head as an applied example of the resist pattern of the present invention using the resist pattern thickening material of the present invention. Note that, in Example 4, resist patterns 102 and 126 which will be described hereinafter are resist patterns which have been thickened by the same process as in Example 1 by using the resist pattern thickening material of the present invention.

FIGS. 35 through 38 are process diagrams for explaining the fabricating of the recording head.

Figure 35:
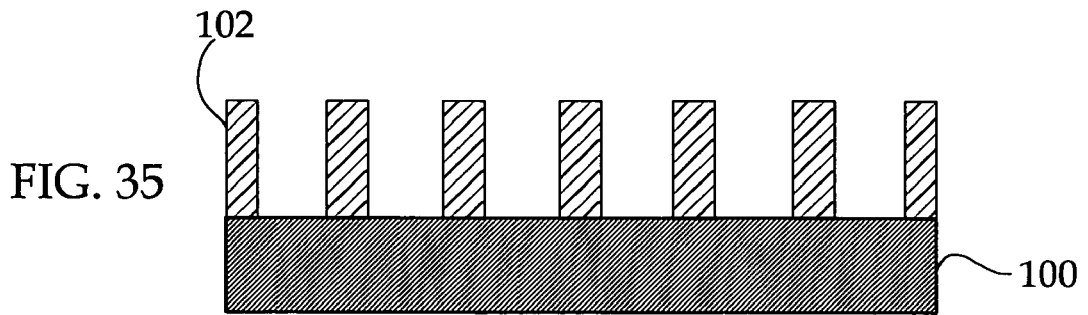
FIG. 35 is a cross-sectional schematic diagram for explaining an example in which a resist pattern, which has been thickened by using the resist pattern thickening material of the present invention, is applied to the fabricating of a recording head.

First, as shown in FIG. 35, a resist film was formed to a thickness of 6 μm on an interlayer insulating film 100. Exposure and development were carried out, so as to form the resist pattern 102 having an opening pattern for formation of a spiral, thin film magnetic coil.

Figure 36:
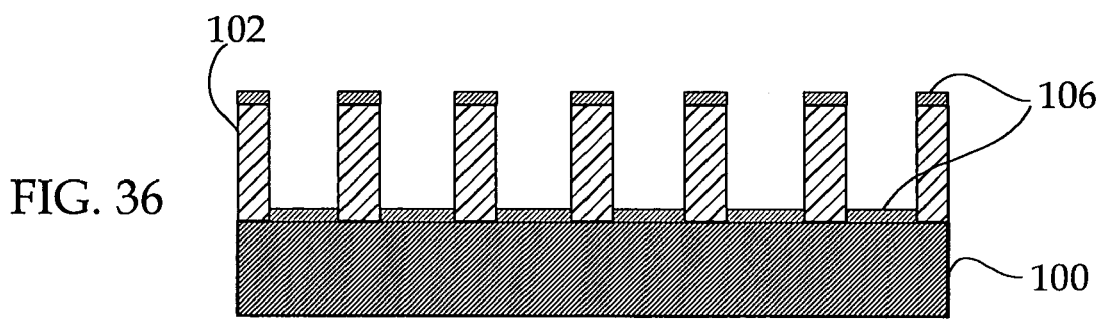
FIG. 36 is a cross-sectional schematic diagram for explaining an example in which a resist pattern, which has been thickened by using the resist pattern thickening material of the present invention, is applied to the fabricating of a recording head, and showing a step after the step shown in FIG. 35.

Next, as shown in FIG. 36, a plating substrate 106 was formed by vapor deposition on the interlayer insulating film 100, both on the resist pattern 102 and on the regions where the resist pattern 102 was not formed, i.e., the exposed surfaces of openings 104. The plating substrate 106 was a laminate of a Ti adhering film having a thickness of 0.01 μm and a Cu adhering film having a thickness of 0.05 μm.

Figure 37:
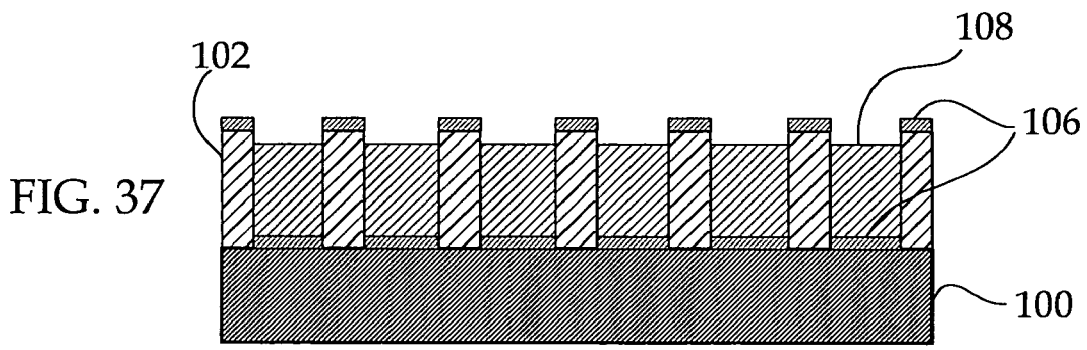
FIG. 37 is a cross-sectional schematic diagram for explaining an example in which a resist pattern, which has been thickened by using the resist pattern thickening material of the present invention, is applied to the fabricating of a recording head, and showing a step after the step shown in FIG. 36.

Next, as shown in FIG. 37, a thin film conductor 108, which was formed by a Cu plating film of a thickness of 3 μm, was formed on the interlayer insulating film 100, at the regions where the resist pattern 102 was not formed, i.e., on the surfaces of the plating substrate 106 formed on the exposed surfaces of the openings 104.

Figure 38:
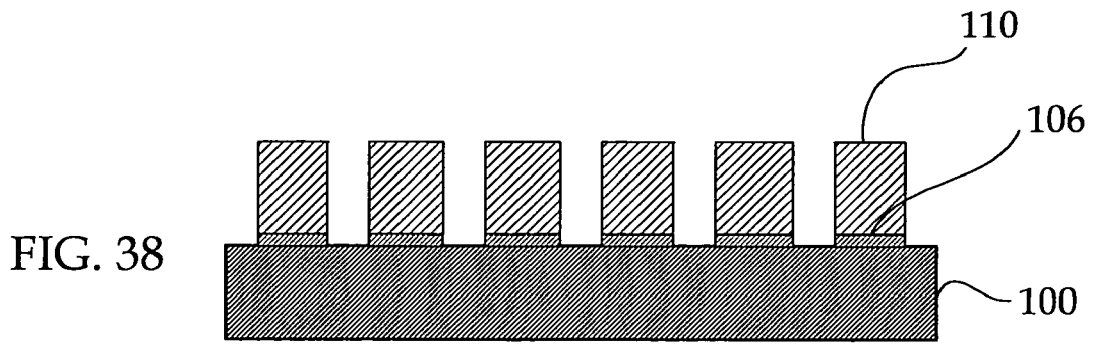
FIG. 38 is a cross-sectional schematic diagram for explaining an example in which a resist pattern, which has been thickened by using the resist pattern thickening material of the present invention, is applied to the fabricating of a recording head, and showing a step after the step shown in FIG. 37.

Then, as shown in FIG. 38, when the resist pattern 102 was melted and removed and lifted off from the interlayer insulating film 100, a thin film magnetic coil 110, which was formed by the spiral pattern of the thin film conductor 108, was formed.

The recording head was thereby fabricated.

At the obtained recording head, the spiral pattern was formed to be fine by the resist pattern 102 which was thickened by using the resist pattern thickening material of the present invention. Thus, the thin film magnetic coil 110 was fine and detailed, and was extremely well suited to mass production.

FIGS. 39 through 44 are process diagrams for explaining fabrication of another recording head.

Figure 39:
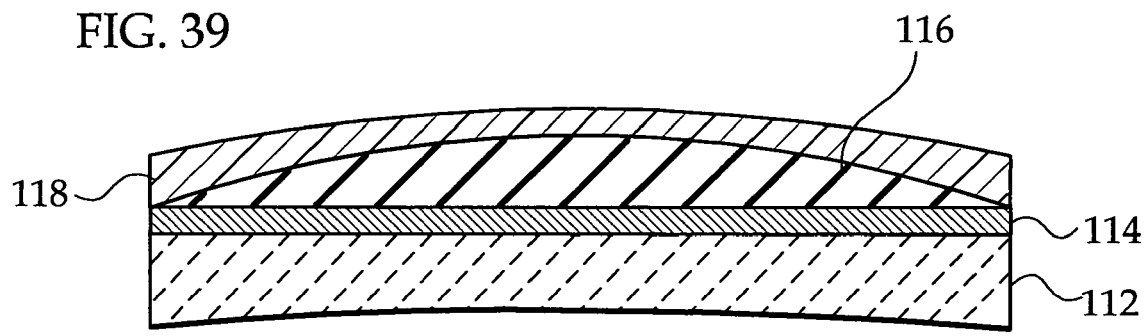
FIG. 39 is a cross-sectional schematic diagram for explaining an example in which a resist pattern, which has been thickened by using the resist pattern thickening material of the present invention, is applied to the fabricating of a recording head, and showing a step after the step shown in FIG. 38.

As shown in FIG. 39, a gap layer 114 was formed by a sputtering method to cover a non-magnetic substrate 112 formed of ceramic. Note that an insulator layer (not illustrated) formed of silicon oxide and a conductive substrate and the like (not illustrated) formed of an Ni—Fe permalloy were formed in advance by a sputtering method to cover the non-magnetic substrate 112, and a lower portion magnetic layer (not illustrated) formed of an Ni—Fe permalloy was additionally formed on the non-magnetic substrate 112. Then, a resin insulating film 116, which was formed by a thermosetting resin, was formed on predetermined regions on the gap layer 114, except for the portions which were to become the magnetic distal end portions of the aforementioned unillustrated lower portion magnetic layer. Next, a resist material was applied on the resin insulating film 116 so as to form a resist film 118.

Figure 40:
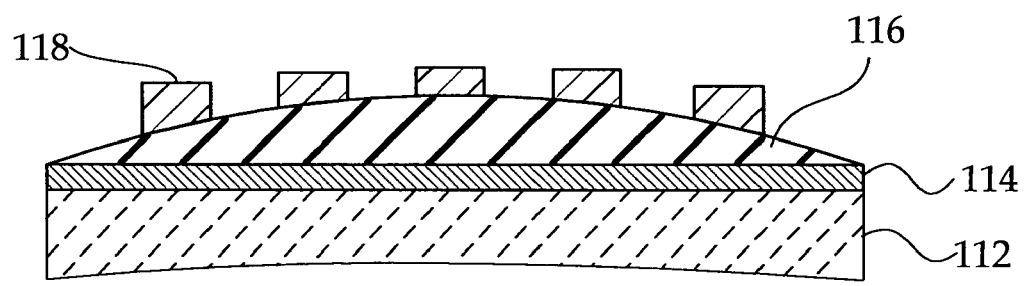
FIG. 40 is a cross-sectional schematic diagram for explaining an example in which a resist pattern, which has been thickened by using the resist pattern thickening material of the present invention, is applied to the fabricating of a recording head, and showing a step after the step shown in FIG. 39.
Figure 41:
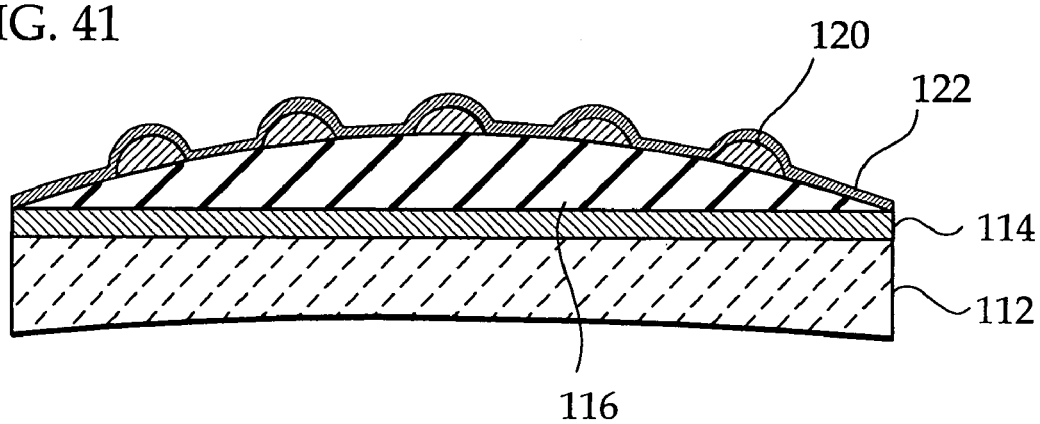
FIG. 41 is a cross-sectional schematic diagram for explaining an example in which a resist pattern, which has been thickened by using the resist pattern thickening material of the present invention, is applied to the fabricating of a recording head, and showing a step after the step shown in FIG. 40.

Then, as shown in FIG. 40, the resist film 118 was exposed and developed, such that a spiral pattern was formed. Subsequently, as shown in FIG. 41, the resist film 118 of the spiral pattern was subjected to thermosetting processing for about one hour at a temperature of several hundred degrees Celsius, such that a first spiral pattern 120, which was shaped as projections, was formed. Then, a conductive substrate 122 formed of Cu was formed to cover the surface of the first spiral pattern 120.

Figure 42:
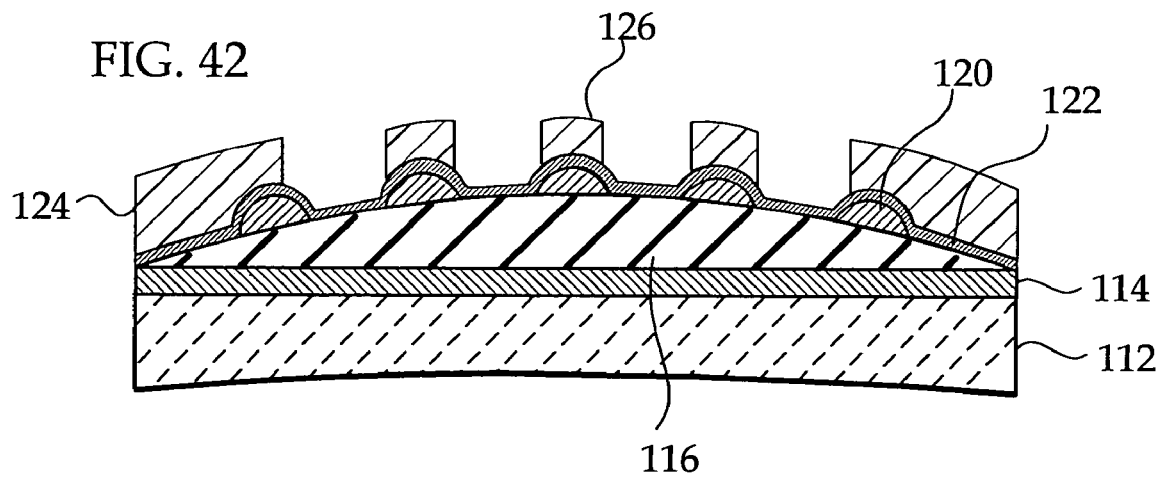
FIG. 42 is a cross-sectional schematic diagram for explaining an example in which a resist pattern, which has been thickened by using the resist pattern thickening material of the present invention, is applied to the fabricating of a recording head, and showing a step after the step shown in FIG. 41.

Next, as shown in FIG. 42, a resist material was coated on the conductive substrate 122 by a spin coating method so as to form a resist film 124. Thereafter, the resist film 124 was patterned on the first spiral pattern 120, such that the resist pattern 126 was formed.

Figure 43:
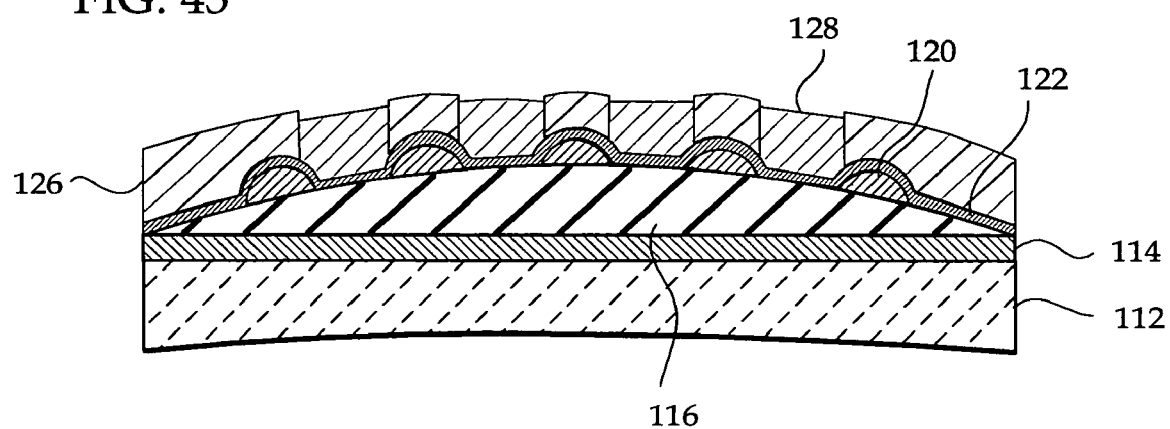
FIG. 43 is a cross-sectional schematic diagram for explaining an example in which a resist pattern, which has been thickened by using the resist pattern thickening material of the present invention, is applied to the fabricating of a recording head, and showing a step after the step shown in FIG. 42.
Figure 44:
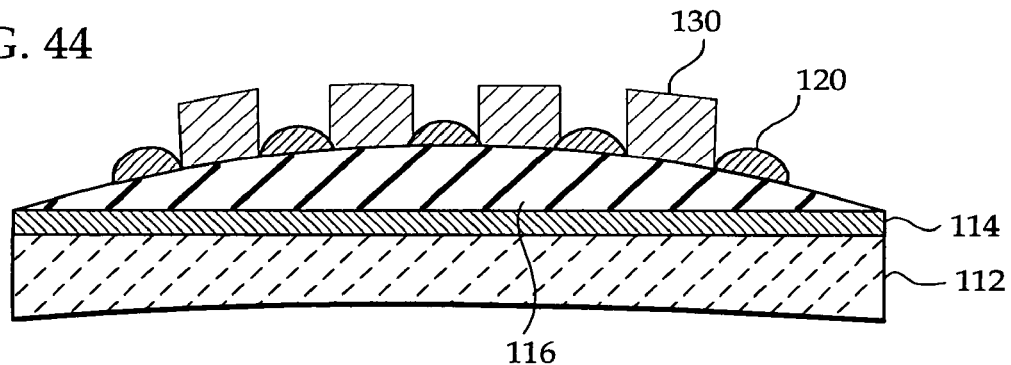
FIG. 44 is a cross-sectional schematic diagram for explaining an example in which a resist pattern, which has been thickened by using the resist pattern thickening material of the present invention, is applied to the fabricating of a recording head, and showing a step after the step shown in FIG. 43.

Then, as shown in FIG. 43, a Cu conductor layer 128 was formed by a plating method on the exposed surface of the conductive substrate 122, i.e., at the regions where the resist pattern 126 was not formed. Thereafter, as shown in FIG. 44, by dissolving and removing the resist pattern 126, the resist pattern 126 was lifted-off from the conductive substrate 122, such that a spiral, thin film magnetic coil 130 formed of the Cu conductor layer 128 was formed.

Figure 45:
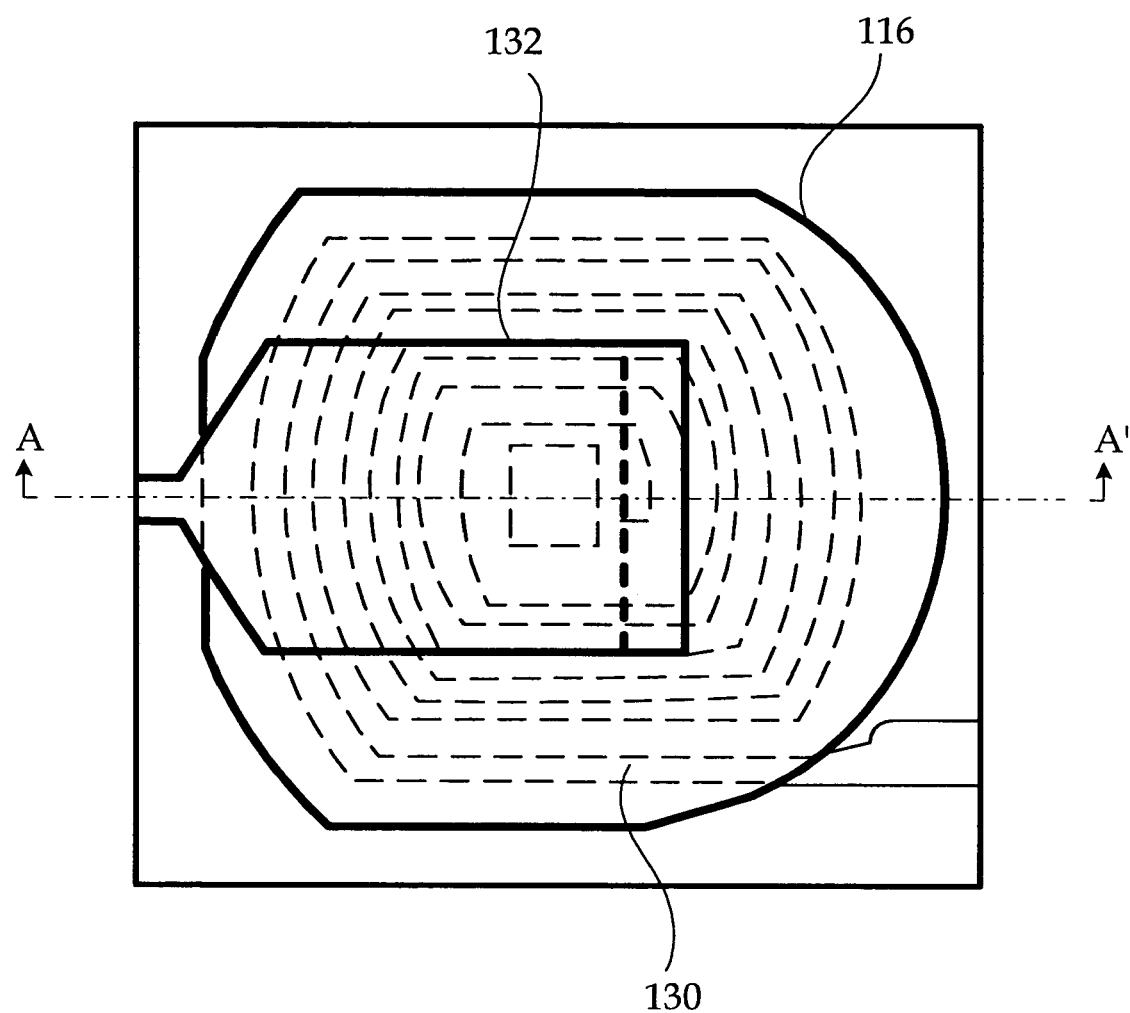
FIG. 45 is a plan view showing an example of the recording head fabricated by the processes of FIGS. 35 through 44.

In this way, a recording head, such as that shown in plan view in FIG. 45, was fabricated which had a magnetic layer 132 on the resin insulating film 116 and had the thin film magnetic coil 130 on the surface.

At the obtained magnetic head, the spiral pattern was formed to be fine by the resist pattern 126 which was thickened by using the resist pattern thickening material of the present invention. Therefore, the thin film magnetic coil 130 was fine and detailed, and was extremely well suited to mass production.

The present invention enables to solve the conventional problems and obtain following features.

Namely, the present invention provides a resist pattern thickening material which, during patterning a resist pattern to be thickened, can utilize ArF excimer laser light as a light source, and which can thicken a resist pattern formed of ArF resist or the like by being applied thereon regardless of the size of the resist pattern, i.e., line-space pattern, and which has excellent mass productivity, and which can finely form a space pattern, exceeding the exposure limits of light sources.

Moreover, the present invention provides a process for forming a resist pattern which, during patterning a resist pattern to be thickened, can utilize ArF excimer laser light as a light source, and which can thicken a resist pattern formed of ArF resist or the like by being applied thereon regardless of the size of the resist pattern, i.e., line-space pattern, and which has excellent mass productivity, and which can finely form a space pattern, exceeding the exposure limits of such light sources.

Further, the present invention provides a process for manufacturing a semiconductor device which, during patterning a resist pattern to be thickened, can utilize ArF excimer laser light as a light source, and which can finely form a space pattern, exceeding the exposure limits of such light sources, and by using the space pattern, which has been formed to be fine, as a mask pattern, can form a fine pattern on an substrate which is an oxide film or the like, and which can efficiently mass produce high-performance semiconductor devices having fine wiring and the like.

The resist pattern thickening material of the present invention is suitably utilized for thickening a resist pattern formed of ArF resist or the like while using light as an exposure light source during patterning, and forming fine patterns, i.e., space pattern, or wiring pattern, exceeding the exposure limit of the light source. Thus the resist pattern thickening material of the present invention is suitably applicable for a process for forming a resist pattern and process for manufacturing a semiconductor device of the present invention.

The process for forming a resist pattern of the present invention is suitably applicable for functional parts such as a mask pattern, a reticule pattern, a magnetic head, LCD (liquid crystalline display), PDP (plasma display panel), SAW filter (surface acoustic wave filter) and the like, optical parts used for connecting to an optical wiring, fine pats such as micro actuator and the like, and for manufacturing a semiconductor. The process for forming a resist pattern material of the present invention is suitably utilized for a process for manufacturing a semiconductor device of the present invention.

The process for manufacturing a semiconductor of the present invention is suitably applicable for a manufacturing procedure of various semiconductor devices, such as flash memory, DRAM, FRAM and the like.

What is claimed is:

1. A resist pattern thickening material comprising:
   a resin which exhibits at least one of water-solubility and alkali-solubility;
   a phase transfer catalyst, said phase transfer catalyst being an onium salt compound that is at least one of a quaternary ammonium salt, a pyridinium salt, a thiazolium salt, a phosphonium salt, piperazinium salt, an ephedrinium salt, a quininium salt, and a cinchoninium salt; and
   water as a solvent;
   wherein the resist pattern is formed of a positive resist, and the resist pattern thickening material exhibits water-solubility; and
   wherein the resist pattern thickening material is applied to a resist pattern.

2. A resist pattern thickening material according to claim 1, a content of the phase transfer catalyst is 10,000 ppm or less.

3. A resist pattern thickening material according to claim 1, a content of the phase transfer catalyst is 50,000 ppm or less.

4. A resist pattern thickening material according to claim 1, wherein the resin has a cyclic structure at least at a part thereof.

5. A resist pattern thickening material according to claim 4, wherein the cyclic structure is at least one of an aromatic structure, an alicyclic structure, and a heterocyclic structure.

6. A resist pattern thickening material according to claim 4, wherein a mol content of the cyclic structure in the resin is 5 mol % or more.

7. A resist pattern thickening material according to claim 1, wherein the resin is at least one of polyvinyl alcohol, polyvinyl acetal, and polyvinyl acetate.

8. A resist pattern thickening material according to claim 1, wherein the resin comprises polyvinyl acetate at 5% by mass to 40% by mass with respect to the total mass of the resin.

9. A resist pattern thickening material according to claim 1, wherein the resin comprises two or more polar groups.

10. A resist pattern thickening material according to claim 9, wherein the polar group is one of a hydroxyl group, an amino group, a sulfonyl group, a carbonyl group, a carboxyl group, and a derivative group thereof.

11. A resist pattern thickening material according to claim 1, further comprising a crosslinking agent.

12. A resist pattern thickening material according to claim 11, wherein the crosslinking agent is at least one of a melamine derivative, a urea derivative, and an uril derivative.

13. A resist pattern thickening material according to claim 1, further comprising a surfactant.

14. A resist pattern thickening material according to claim 13, wherein the surfactant is at least one of a non-ionic surfactant, a cationic surfactant, an anionic surfactant, and an amphoteric surfactant.

15. A resist pattern thickening material according to claim 14, wherein the surfactant is at least one of a polyoxyethylene-polyoxypropylene condensation compound, a polyoxyalkylene alkylether compound, a polyoxyethylene alkylether compound, a polyoxyethylene derivative, a sorbitan fatty acid ester compound, a glycerin fatty acid ester compound, a primary alcohol ethoxylate compound, a phenol ethoxylate compound, an alkoxylate surfactant, a fatty acid ester surfactant, an amide surfactant, an alcohol surfactant, and an ethylene diamine surfactant.

16. A resist pattern thickening material according to claim 1, further comprising a cyclic structure-containing compound.

17. A resist pattern thickening material according to claim 16, wherein the cyclic structure-containing compound exhibits solubility of 1 g or more, in 100 g of water at a water-temperature of 25° C. or in 100 g of a 2.38% by mass tetramethylammoniumhydroxide aqueous solution at a solution temperature of 25° C.

18. A resist pattern thickening material according to claim 16, wherein the cyclic structure-containing compound comprises two or more polar groups.

19. A resist pattern thickening material according to claim 18, wherein the polar group is one of a hydroxyl group, an amino group, a sulfonyl group, a carbonyl group, a carboxyl group, and a derivative group thereof.

20. A resist pattern thickening material according to claim 16, wherein the cyclic structure-containing compound is at least one of an aromatic compound, an alicyclic compound, and a heterocyclic compound.

21. A resist pattern thickening material according to claim 20, wherein
the aromatic compound is one of a polyphenol compound, an aromatic carbonic acid compound, a naphthalene polyhydroxyl group, a benzophenone compound, a flavonoid compound, a derivative thereof, and a glycoside thereof;
the alicyclic compound is one of a polycycloalkane, a cycloalkane, a steroid compound, a derivative thereof, and a glycoside thereof; and
the heterocyclic compound is one of a pyrrolidine, a pyridine, an imidazole, an oxazole, a morpholine, a furan, a pyrane, a derivative thereof and a glycoside thereof.

22. A resist pattern thickening material according to claim 1, further comprising an organic solvent.

23. A resist pattern thickening material according to claim 22, wherein the organic solvent is at least one of an alcohol solvent, a straight-chain ester solvent, a cyclic ester solvent, a ketone solvent, a straight-chain ether solvent, and a cyclic ether solvent.

24. A process for forming a resist pattern, comprising the step of:
applying a resist pattern thickening material over a resist pattern to be thickened, after forming the resist pattern to be thickened, so as to thicken the resist pattern to be thickened,
wherein the resist pattern thickening material comprises:
a resin which exhibits at least one of water-solubility and alkali-solubility;
a phase transfer catalyst, said phase transfer catalyst being an onium salt compound that is at least one of a quaternary ammonium salt, a pyridinium salt, a thiazolium salt, a phosphonium salt, piperazinium salt, an ephedrinium salt, a quininium salt, and a cinchoninium salt, and
water as a solvent,
wherein the resist pattern thickening material exhibits water-solubility.

25. A process for forming a resist pattern according to claim 24, further comprising the step of developing the resist pattern thickening material after the step of applying the resist pattern thickening material.

26. A process for forming a resist pattern according to claim 25, wherein the resist pattern thickening material is developed with water in the step of developing.

27. A process for manufacturing a semiconductor device, comprising the steps of:
forming a resist pattern to be thickened on a substrate;
applying a resist pattern thickening material over the resist pattern to be thickened so as to thicken the resist pattern to be thickened and form a resist pattern; and
etching the substrate by using the resist pattern as a mask so as to form a pattern on the substrate,
wherein the resist pattern thickening material comprises:
a resin;
a phase transfer catalyst, said phase transfer catalyst being an onium salt compound that is at least one of a quaternary ammonium salt, a pyridinium salt, a thiazolium salt, a phosphonium salt, piperazinium salt, an ephedrinium salt, a quininium salt, and a cinchoninium salt, and
water as a solvent,
wherein the resist pattern thickening material exhibits water-solubility.

28. A process for manufacturing a semiconductor device according to claim 27, wherein the substrate is a surface of a semiconductor base.

29. A process for manufacturing a semiconductor device according to claim 27, wherein the resist pattern is formed of ArF resist or a resist comprising an acrylic resin.

30. A process for manufacturing a semiconductor device according to claim 29, wherein the ArF resist is at least one of an acrylic resin having an alicyclic group at a side chain thereof a cycloolefine-maleic acid anhydride resist and a cycloolefine resist.

31. A process for manufacturing a semiconductor device according to claim 27, further comprising the step of applying a surfactant onto the surface of the resist pattern to be thickened, before the step of applying the resist pattern thickening material,
wherein the surfactant is at least one non-ionic surfactant selected from a polyoxyethylene-polyoxypropylene condensation compound, a polyoxyalkylene alkylether compound, a polyoxyethylene alkylether compound, a polyoxyethylene derivative, a sorbitan fatty acid ester compound, a glycerin fatty acid ester compound, a primary alcohol ethoxylate compound, a phenol ethoxylate compound.

32. A process for manufacturing a semiconductor device according to claim 27, wherein a space pattern formed by the resist pattern is one of a line-space pattern, a hole pattern, and a trench pattern.

33. A process for forming a resist pattern according to claim 24, wherein a content of the phase transfer catalyst is 10,000 ppm or less.

34. A process for forming a resist pattern according to claim 24, wherein a content of the phase transfer catalyst is 50,000 ppm or less.

35. A process for forming a resist pattern according to claim 24, wherein at least a part of the resin has a cyclic structure.

36. A process for forming a resist pattern according to claim 35, wherein the cyclic structure is at least one of an aromatic structure, an alicyclic structure, and a heterocyclic structure.

37. A process for forming a resist pattern according to claim 35, wherein a mol content of the cyclic structure in the resin is 5 mol % or more.

38. A process for forming a resist pattern according to claim 24, wherein the resin is at least one of polyvinyl alcohol, polyvinyl acetal, and polyvinyl acetate.

39. A process for forming a resist pattern according to claim 24, wherein the resin comprises polyvinyl acetate at 5% by mass to 40% by mass with respect to the total mass of the resin.

40. A process for forming a resist pattern according to claim 24, wherein the resin comprises two or more polar groups.

41. A process for forming a resist pattern according to claim 40, wherein the polar group is one of a hydroxyl group, an amino group, a sulfonyl group, a carbonyl group, a carboxyl group, and a derivative group thereof.

42. A process for forming a resist pattern according to claim 24, further comprising a crosslinking agent.

43. A process for forming a resist pattern according to claim 42, wherein the crosslinking agent is at least one of a melamine derivative, a urea derivative, and an uril derivative.

44. A process for forming a resist pattern according to claim 24, further comprising a surfactant.

45. A process for forming a resist pattern according to claim 44, wherein the surfactant is at least one of a non-ionic surfactant, a cationic surfactant, an anionic surfactant, and an amphoteric surfactant.

46. A process for forming a resist pattern according to claim 45, wherein the surfactant is at least one of a polyoxyethylene-polyoxypropylene condensation compound, a polyoxyalkylene alkylether compound, a polyoxyethylene alkylether compound, a polyoxyethylene derivative, a sorbitan fatty acid ester compound, a glycerin fatty acid ester compound, a primary alcohol ethoxylate compound, a phenol ethoxylate compound, an alkoxylate surfactant, a fatty acid ester surfactant, an amide surfactant, an alcohol surfactant, and an ethylene diamine surfactant.

47. A process for forming a resist pattern according to claim 24, further comprising a cyclic structure-containing compound.

48. A process for forming a resist pattern according to claim 47, wherein the cyclic structure-containing compound exhibits solubility of 1 g or more, in 100 g of water at a water-temperature of 25° C. or in 100 g of a 2.38% by mass tetramethylammoniumhydroxide aqueous solution at a solution temperature of 25° C.

49. A process for forming a resist pattern according to claim 47, wherein the cyclic structure-containing compound comprises two or more polar groups.

50. A process for forming a resist pattern according to claim 49, wherein the polar group is one of a hydroxyl group, an amino group, a sulfonyl group, a carbonyl group, a carboxyl group, and a derivative group thereof.

51. A process for forming a resist pattern according to claim 47, wherein the cyclic structure-containing compound is at least one of an aromatic compound, an alicyclic compound, and a heterocyclic compound.

52. A process for forming a resist pattern according to claim 51, wherein the aromatic compound is one of a polyphenol compound, an aromatic carbonic acid compound, a naphthalene polyhydroxyl group, a benzophenone compound, a flavonoid compound, a derivative thereof, and a glycoside thereof;
the alicyclic compound is one of a polycycloalkane, a cycloalkane, a steroid compound, a derivative thereof, and a glycoside thereof; and
the heterocyclic compound is one of a pyrrolidine, a pyridine, an imidazole, an oxazole, a morpholine, a furan, a pyrane, a derivative thereof and a glycoside thereof.

53. A process for forming a resist pattern according to claim 24, further comprising an organic solvent.

54. A process for forming a resist pattern according to claim 53, wherein the organic solvent is at least one of an alcohol solvent a straight-chain ester solvent, a cyclic ester solvent, a ketone solvent, a straight-chain ether solvent, and a cyclic ether solvent.

55. A resist pattern thickening material comprising:
a resin which exhibits at least one of water-solubility and alkali-solubility;
a phase transfer catalyst, said phase transfer catalyst being an onium salt compound that is at least one of a quaternary ammonium salt, a pyridinium salt, a thiazolium salt, a phosphonium salt, piperazinium salt, an ephedrinium salt, a quininium salt, and a cinchoninium salt;
a surfactant, said surfactant being any one of a polykaryotic phenol surfactant and a primary alcohol ethoxylate surfactant; and
water as a solvent;
wherein the resist pattern is formed of a positive resist, and the resist pattern thickening material exhibits water-solubility.

56. A resist pattern thickening material comprising:
a resin which exhibits at least one of water-solubility and alkali-solubility;
a phase transfer catalyst, said phase transfer catalyst being an onium salt compound that is at least one of a quaternary ammonium salt, a pyridinium salt, a thiazolium salt, a phosphonium salt, piperazinium salt, an ephedrinium salt, a quininium salt, and a cinchoninium salt; and
water as a solvent;
wherein the resist pattern is formed of a positive resist, and the resist pattern thickening material exhibits water-solubility, and a content of the phase transfer catalyst is 10,000 ppm or less.

* * * * *